US009532464B2

(12) United States Patent
Ishihara et al.

(10) Patent No.: US 9,532,464 B2
(45) Date of Patent: Dec. 27, 2016

(54) LED LIGHTING APPARATUS

(71) Applicant: ROHM CO., LTD., Kyoto-shi, Kyoto (JP)

(72) Inventors: Takayuki Ishihara, Kyoto (JP); Satohiro Kigoshi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 64 days.

(21) Appl. No.: 14/328,097

(22) Filed: Jul. 10, 2014

(65) Prior Publication Data

US 2015/0023016 A1    Jan. 22, 2015

(30) Foreign Application Priority Data

Jul. 22, 2013   (JP) .................................. 2013-151886
Jul. 22, 2013   (JP) .................................. 2013-151887

(51) Int. Cl.
| *H01L 21/00* | (2006.01) |
| *H05K 3/28* | (2006.01) |
| *F21V 5/04* | (2006.01) |
| *F21V 7/00* | (2006.01) |
| *F21V 23/00* | (2015.01) |
| *H05K 1/02* | (2006.01) |
| *H05K 1/18* | (2006.01) |
| *F21Y 101/00* | (2016.01) |

(52) U.S. Cl.
CPC ................. *H05K 3/284* (2013.01); *F21K 9/20* (2016.08); *F21V 5/04* (2013.01); *F21V 7/0091* (2013.01); *F21V 23/005* (2013.01); *F21Y 2101/00* (2013.01); *F21Y 2105/10* (2016.08); *F21Y 2115/10* (2016.08); *H05K 1/0274* (2013.01); *H05K 1/181* (2013.01); *H05K 2201/0108* (2013.01); *H05K 2201/10106* (2013.01); *H05K 2203/049* (2013.01)

(58) Field of Classification Search
CPC ......... F21K 9/30; H05K 3/284; H05K 1/0274; H05K 1/1841; F21V 5/04; F21V 7/0091; F21V 23/005
See application file for complete search history.

(56) References Cited

U.S. PATENT DOCUMENTS

| 7,192,147 B2 | 3/2007 | Sakata et al. | |
| 2011/0108875 A1* | 5/2011 | Takenaka | ................ H01L 33/44 257/98 |
| 2012/0113328 A1* | 5/2012 | Takeshima | ........ G02F 1/133603 348/739 |
| 2013/0170250 A1* | 7/2013 | Kikuchi | ............... G02B 6/0038 362/609 |

FOREIGN PATENT DOCUMENTS

| JP | 2003-329978 | 11/2003 |
| JP | 2013-55172 | 3/2013 |

* cited by examiner

*Primary Examiner* — Richard Booth
(74) *Attorney, Agent, or Firm* — Hamre, Schumann, Mueller & Larson, P.C.

(57) ABSTRACT

An LED lighting apparatus includes an LED substrate, a LED chip, a sealing resin member, and a reflecting face. The LED substrate has a main surface. The LED chip is mounted on the main surface of the LED substrate. The sealing resin member is made of a material that transmits light from the LED chip. The sealing resin member covers the LED chip. The sealing resin member has a shape bulging in the direction in which the main surface faces. The reflecting face surrounds the sealing resin member.

28 Claims, 27 Drawing Sheets

FIG.12
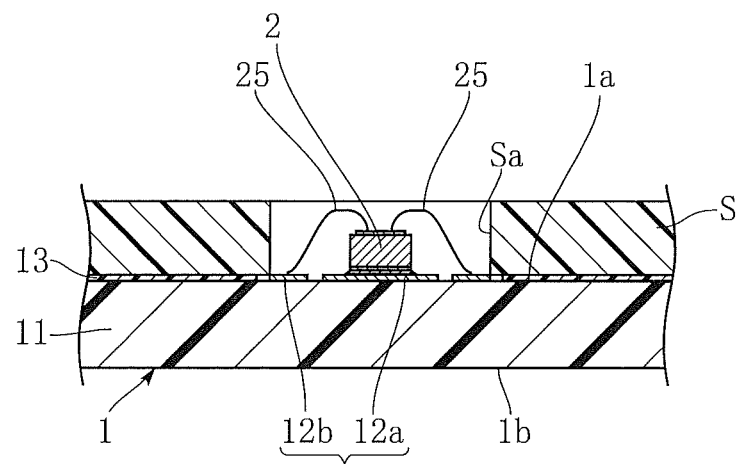
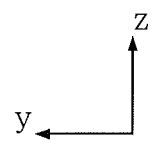
FIG.13
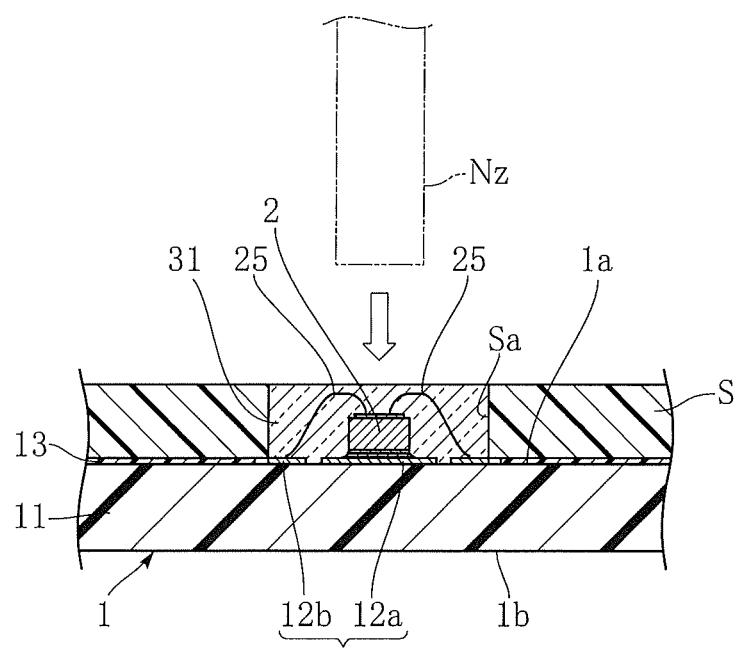
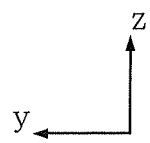

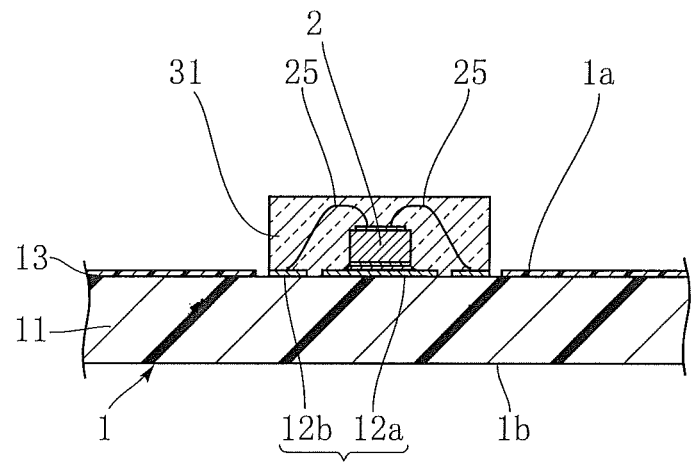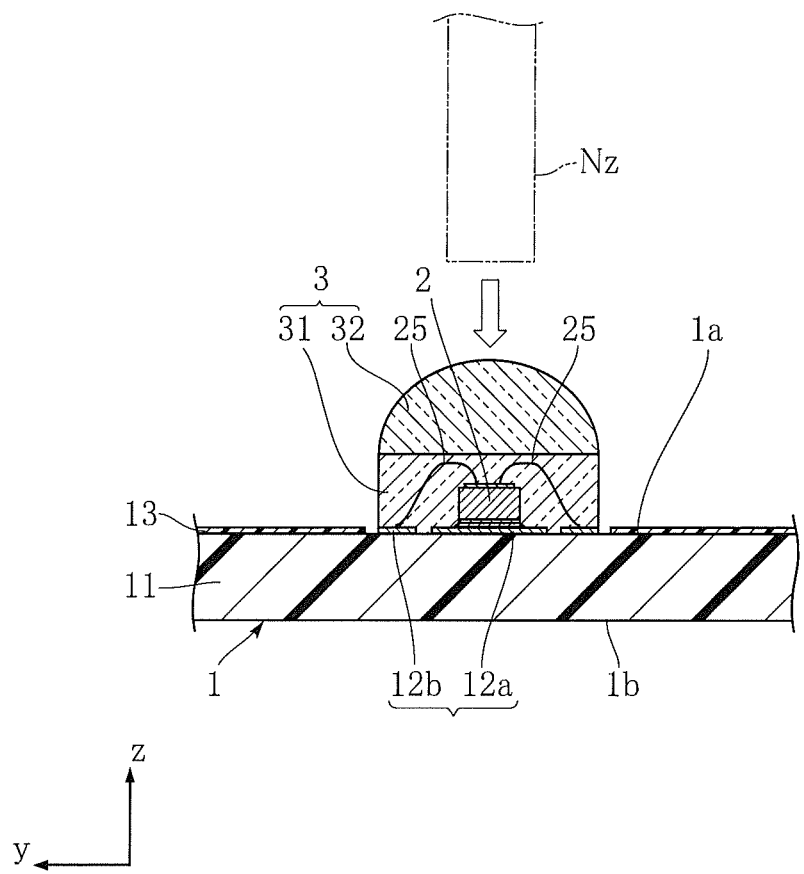

FIG.18
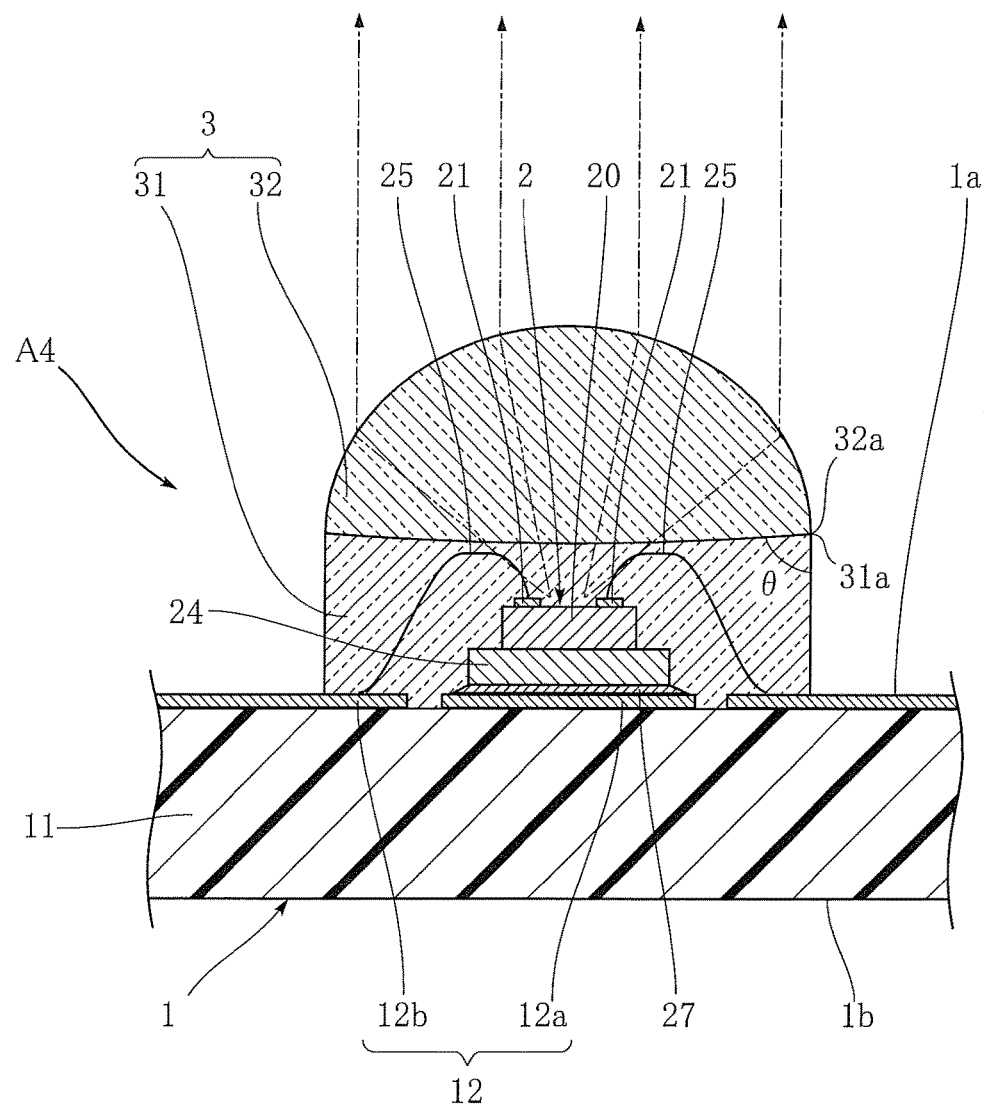
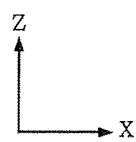

LED LIGHTING APPARATUS

BACKGROUND OF THE INVENTION

1. Field of the Invention

The present invention relates to a lighting apparatus using a light emitting diode (LED).

2. Description of Related Art

Various types of LED lighting devices have been conventionally proposed. For example, JP-A-2003-329978 discloses an LED lighting device provided with a plurality of LED chips and a reflector placed behind the LED chips. In this lighting device, the reflector has a plurality of reflecting faces formed to correspond to the plurality of LED chips.

In the above lighting device, one corresponding LED chip is placed in front of each reflecting face. For this reason, part of light reflected from the reflecting face is blocked by the LED chip, preventing improvement in the brightness of the lighting device.

JP-A-2013-55172 discloses an LED lighting device provided with a plurality of LED chips and a plurality of resin covers each covering the LED chips. The resin covers are formed by dropping a liquid resin material and hardening the material. This technique however causes variations in the shape, height, etc. of the resin covers, preventing improvement in the brightness of the lighting device.

SUMMARY OF THE INVENTION

The present invention has been proposed under the circumstances described above. It is therefore an objective of the invention to provide an LED lighting apparatus suitable for brightness improvement.

An LED lighting apparatus presented according to the first aspect of the invention includes: an LED substrate having a main surface; an LED chip mounted on the main surface of the LED substrate; a sealing resin member made of a material that transmits light from the LED chip, the member covering the LED chip and having a shape of bulging in a direction in which the main surface faces; and a reflecting face surrounding the sealing rein member.

An LED lighting apparatus presented according to the second aspect of the invention includes: an LED substrate having a main surface and a reverse surface; a plurality of LED chips mounted on the main surface of the LED substrate; a plurality of sealing resin members covering the plurality of LED chips, each being made of a light-transmissive material and having a shape of bulging in a direction in which the main surface faces; and a plurality of cases supported by the LED substrate. Each of the plurality of cases includes two reflecting faces adjacent as viewed in the thickness direction of the LED substrate, and each of the reflecting faces surrounds one of the plurality of LED chips.

Other features and advantages of the invention will become more apparent from the following detailed description taken with reference to the accompanying drawings.

BRIEF DESCRIPTION OF THE DRAWINGS

FIG. 12 is a cross-sectional view showing a process step of a production method for the lighting apparatus of FIG. 11.

FIG. 13 is a cross-sectional view showing another process step of the production method.

FIG. 14 is a cross-sectional view showing yet another process step of the production method.

FIG. 15 is a cross-sectional view showing yet another process step of the production method.

FIG. 18 is a cross-sectional view taken along line XVIII-XVIII in FIG. 17.

DETAILED DESCRIPTION OF PREFERRED EMBODIMENTS

Figure 1:
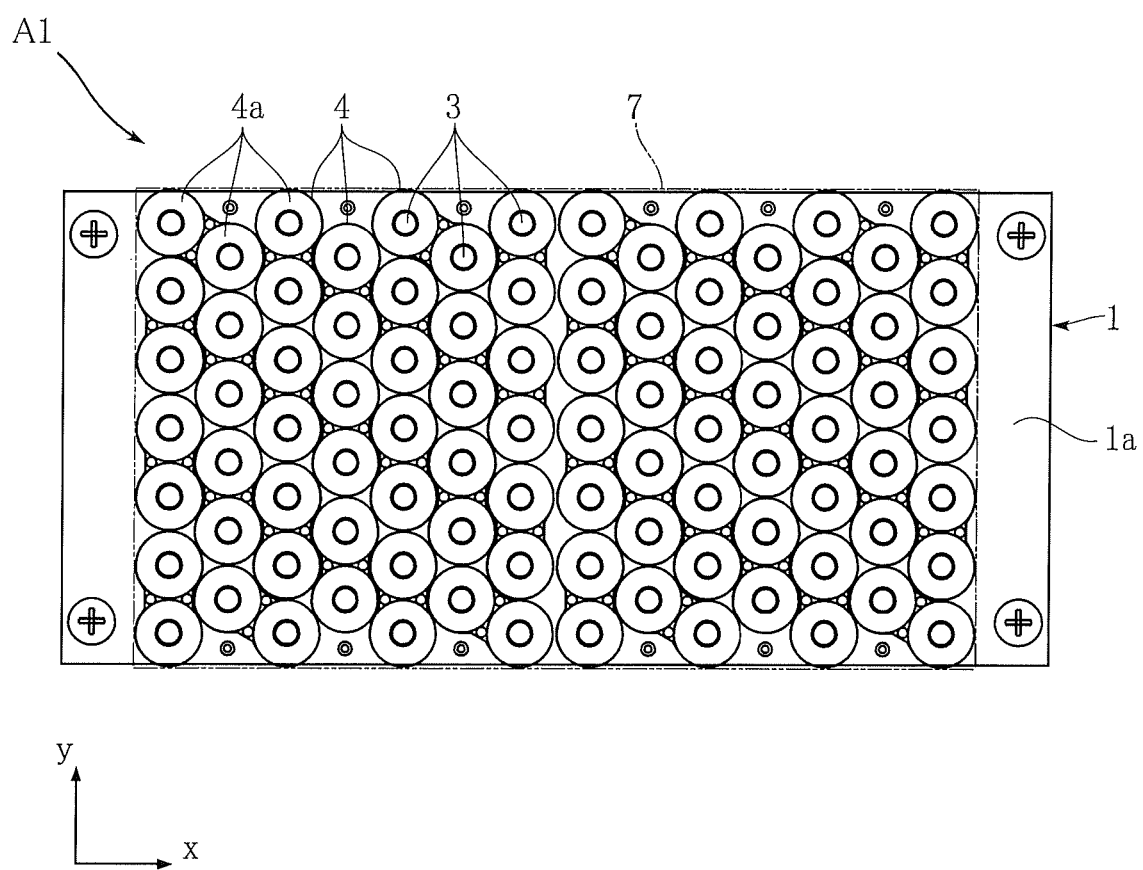
FIG. 1 is a plan view showing an LED lighting apparatus according to the first embodiment of the invention.

Preferred embodiments of the present invention will be specifically described hereinafter with reference to the accompanying drawings.

FIGS. 1 to 10 show an LED lighting apparatus according to the first embodiment of the invention. The lighting apparatus A1 shown includes a substrate (LED substrate) 1, a plurality of LED chips 2, a plurality of sealing resin members 3, a plurality of cases 4, an auxiliary substrate 5, and a cover 7.

Lighting apparatuses according to the invention, including the lighting apparatus A1 of the first embodiment, can be used for various purposes as light sources. For example, the lighting apparatus A1 can be used as a lighting means for a road traffic information system.

Figure 2:
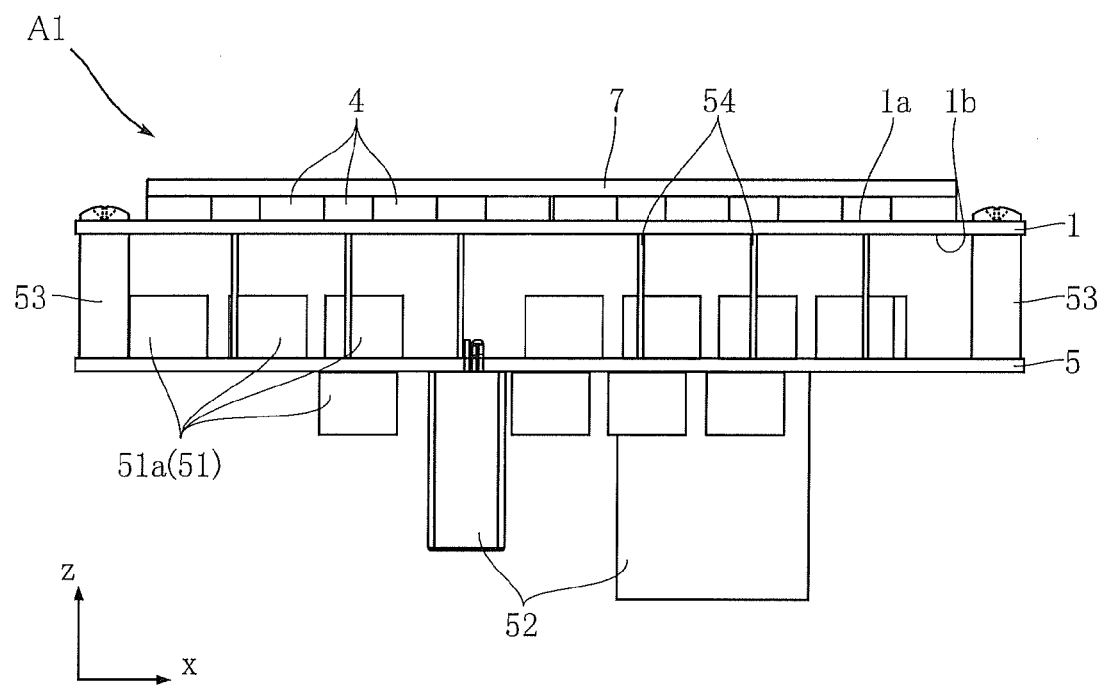
FIG. 2 is a front view showing the lighting apparatus of FIG. 1.
Figure 3:
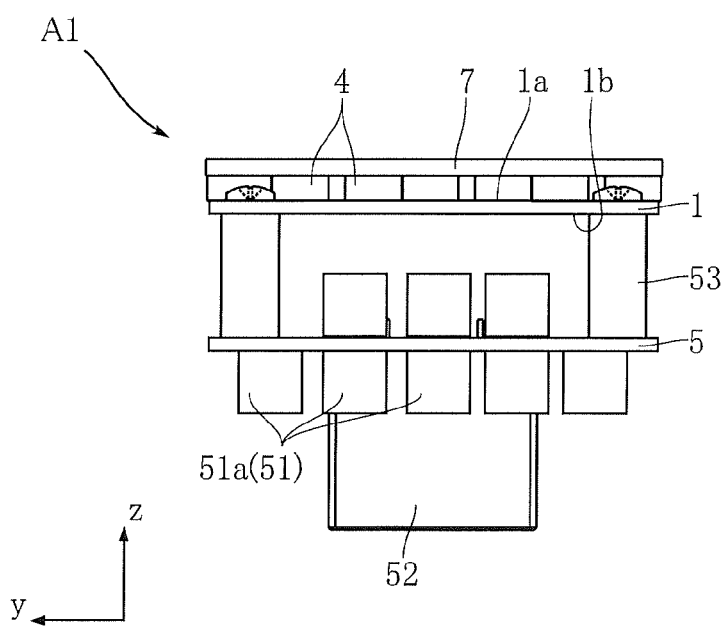
FIG. 3 is a side view showing the lighting apparatus of FIG. 1.

The substrate 1 supports a plurality of LED chips 2. Power supply paths are formed in the substrate 1 for allowing the plurality of LED chips 2 to emit light. The substrate 1 has a main surface 1a and a reverse surface 1b facing opposite to each other. In FIG. 2, the main surface 1a faces upward in the z direction, and the reverse surface 1b faces downward in the z direction. The plurality of LED chips 2 are mounted on the main surface 1a. The size of the substrate 1 is about 116 mm in the x direction and about 55 mm in the y direction, for example. The size of the substrate 1 in the z direction (thickness) is in the range of 0.5 mm to 1.5 mm, and it may be about 1.0 mm, for example.

Figure 6:
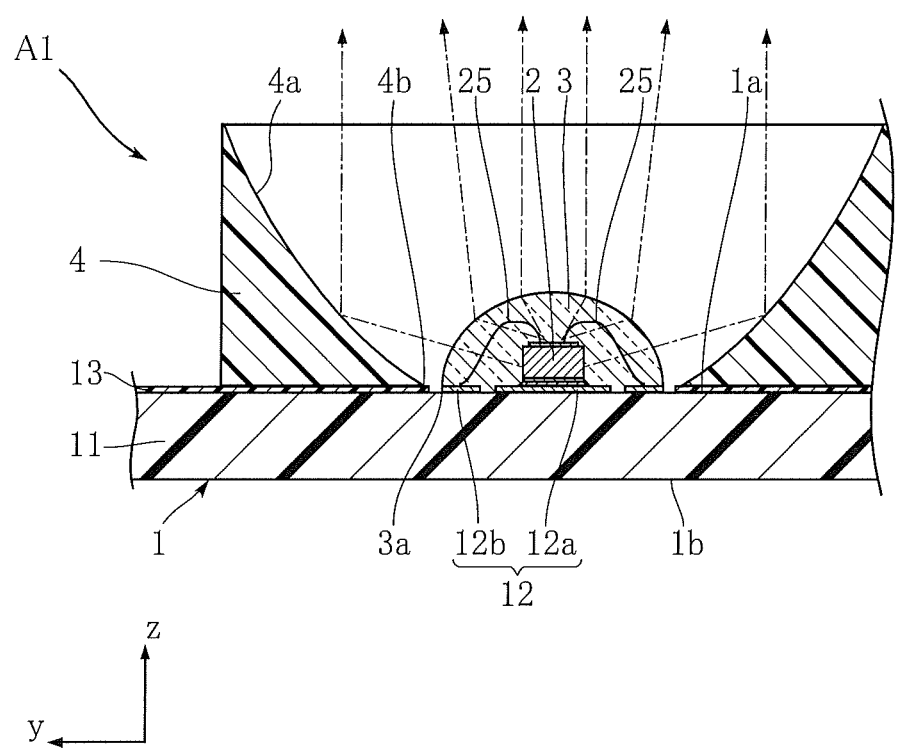
FIG. 6 is a cross-sectional view taken along line VI-VI in FIG. 5.

As shown in FIG. 6, the substrate 1 includes an insulating base 11 and a wiring pattern 12. The insulating material constituting the base 11 is not specifically limited. In this embodiment, the base 11 is formed of a plurality of layers made of a glass epoxy resin placed on top of one another. The main surface 1a of the substrate 1 described above is virtually constituted by the main surface (top surface in FIG. 7) of the base 11, and the reverse surface 1b of the substrate 1 corresponds to the reverse surface of the base 11. As used herein, therefore, the main surface of the base 11 is denoted by 1a, and the reverse surface of the base 11 by 1b.

Figure 5:
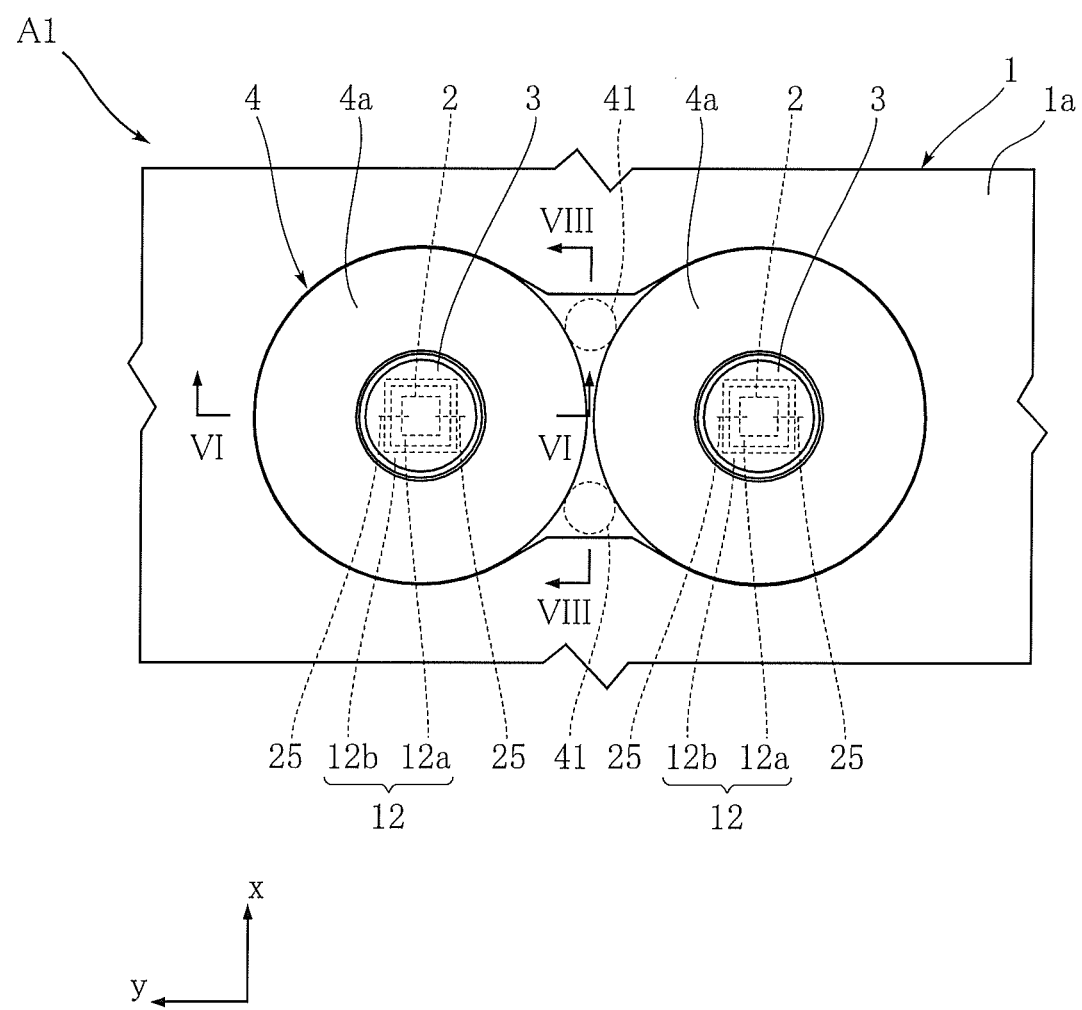
FIG. 5 is a plan view of the part shown in FIG. 4.
Figure 7:
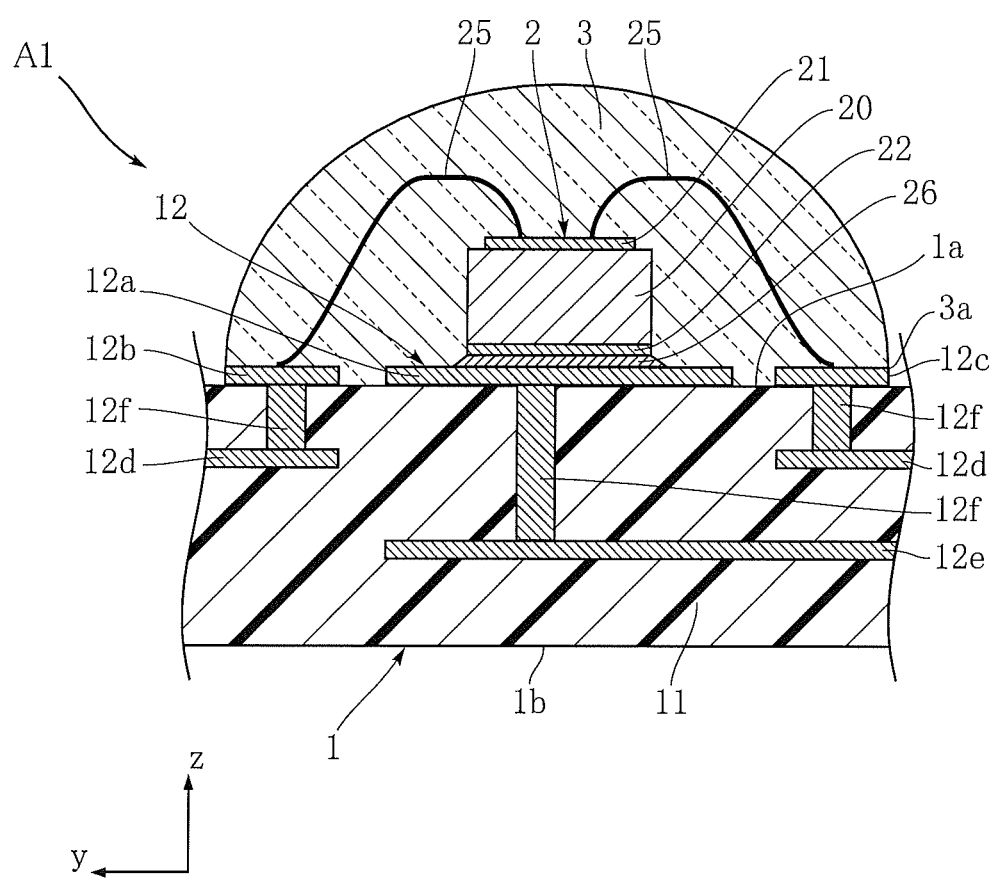
FIG. 7 is a cross-sectional view showing part of the lighting apparatus of FIG. 1.

The wiring pattern 12 includes portions formed on the main surface 1a of the base 11, portions formed on the reverse surface 1b thereof, and portions formed inside the base 11. The wiring pattern 12 is made of a metal such as Cu, Pd, Ni, and Au. The wiring pattern 12 may be constituted by a single layer, or of a plurality of layers placed on top of one another. For the wiring pattern 12 constituted by a plurality of layers, the layers may be formed of the same metal or different metals (it is preferable that at least the outermost layer be formed of Au). As shown in FIGS. 5 to 7, the wiring pattern 12 includes a plurality of die bonding pads 12a, a plurality of wire bonding pads 12b, a plurality of intermediate layers 12d and 12e, and a plurality of through hole portions 12f.

Each die bonding pad 12a is a portion to which its corresponding LED chip 2 is die-bonded, and is formed on the main surface 1a of the base 11. In this embodiment, the die bonding pad 12a is in a shape of a square having a length of one side of about 1.4 mm. As shown in FIG. 5, each wire bonding pad 12b is formed to be apart outwardly from its corresponding die bonding pad 12a and surround the die bonding pad 12a. The inner rim of the wire bonding pad 12b is similar in shape to the die bonding pad 12a: it is in a shape of a square having a length of one side of about 1.7 mm, for example. An outer rim 12c of the wire bonding pad 12b (see FIG. 7) is in a shape of a circle having a diameter of about 2.6 mm, for example. As will be described later, the plurality of die bonding pads 12a are arranged such that each die bonding pad is located at an apex of a triangle. The wiring pattern 12 does not include any portion connected to the die bonding pads 12a or the wire bonding pads 12b on the main surface 1a.

A resist layer 13 is formed on the main surface 1a. The resist layer 13, made of an insulating resin, has a plurality of circular openings for exposing the die bonding pads 12a and the wire bonding pads 12b. The diameter of the openings is about 2.9 mm, for example.

As shown in FIG. 7, the through hole portions 12f are connected to the die bonding pads 12a and the wire bonding pads 12b. Each through hole portion 12f forms a conducting path extending in the direction of the thickness of the base 11 (z direction). The die bonding pads 12a are in conduction with the intermediate layer 12e via the through hole portions 12f. The wire bonding pads 12b are in conduction with the intermediate layer 12d via their through hole portions 12f. The intermediate layers 12d and 12f are formed into predetermined shapes inside the base 11, forming conducting paths spreading in the xy plane.

The plurality of LED chips 2 are die-bonded to the plurality of die bonding pads 12a on the main surface 1a of the substrate 1. In this embodiment, as will be understood from FIGS. 1 and 5, the LED chips 2 are arranged such that each LED chip is located at an apex of a triangle. The length of one side of the triangle is about 8.0 mm, for example.

As shown in FIG. 7, each LED chip 2 has a semiconductor layer 20, an upper electrode 21, and a lower electrode 22. The semiconductor layer 20 has a structure of an n-type semiconductor layer, an active layer, and a p-type semiconductor layer placed on top of one another. In this embodiment, the semiconductor layer 20 is made of an AlInGaNp semiconductor and a GaAs semiconductor, for example, and the LED chip 2 emits infrared light.

The upper electrode 21 is formed on the top surface of the semiconductor layer 20. Ends of two wires 25 are bonded to the upper electrode 21. The other ends of the two wires 25 are bonded to the common wire bonding pad 12b. These wires 25 extend in the opposite directions from the LED chip 2 as viewed from top. The lower electrode 22 is formed on the bottom surface of the semiconductor layer 20 and joined to the die bonding pad 12a with a conductive joining material 26.

The plurality of sealing resin members 3, each covering one corresponding LED chip 2, are made of a material that transmits light from the LED chips 2. As the material of the sealing resin members 3, a transparent epoxy resin or silicone resin may be used. Each sealing resin member 3 also covers the two wires 25. The sealing resin member 3 has a shape of bulging in the direction in which the main surface 1a faces, i.e., upward in the z direction.

The sealing resin member 3 has an outer rim 3a. In this embodiment, the outer rim 3a coincides with the outer rim 12c of the wire bonding pad 12b. Such a sealing resin member 3 is formed, for example, by dropping a liquid epoxy resin or silicone resin material onto the LED chip 2 via a nozzle, etc. after completion of the die-bonding of the LED chip 2 to the die bonding pad 12a and the bonding of the two wires 25. The dropped liquid resin material covers the LED chip 2 and the two wires 25 and also spreads over the main surface 1a. By setting the drop amount, etc. properly, the spread of the resin material can be stopped at the outer rim 12c of the wire bonding pad 12b by the action of surface tension. The resin material is then UV-cured or thermally cured, to obtain the sealing resin member 3 bulging upward in the z direction.

The plurality of cases 4 are provided for reflecting part of light emitted from the LED chips 2 upward in the z direction. In this embodiment, each case 4 is formed of a member made of a white polycarbonate resin with A1 evaporation coating applied thereto. The invention is however not limited to this. For example, if a sufficiently high reflectivity is secured, the case may be formed of only a white resin with no coating applied. Alternatively, the case 4 may be formed of a metal instead of a resin.

Figure 4:
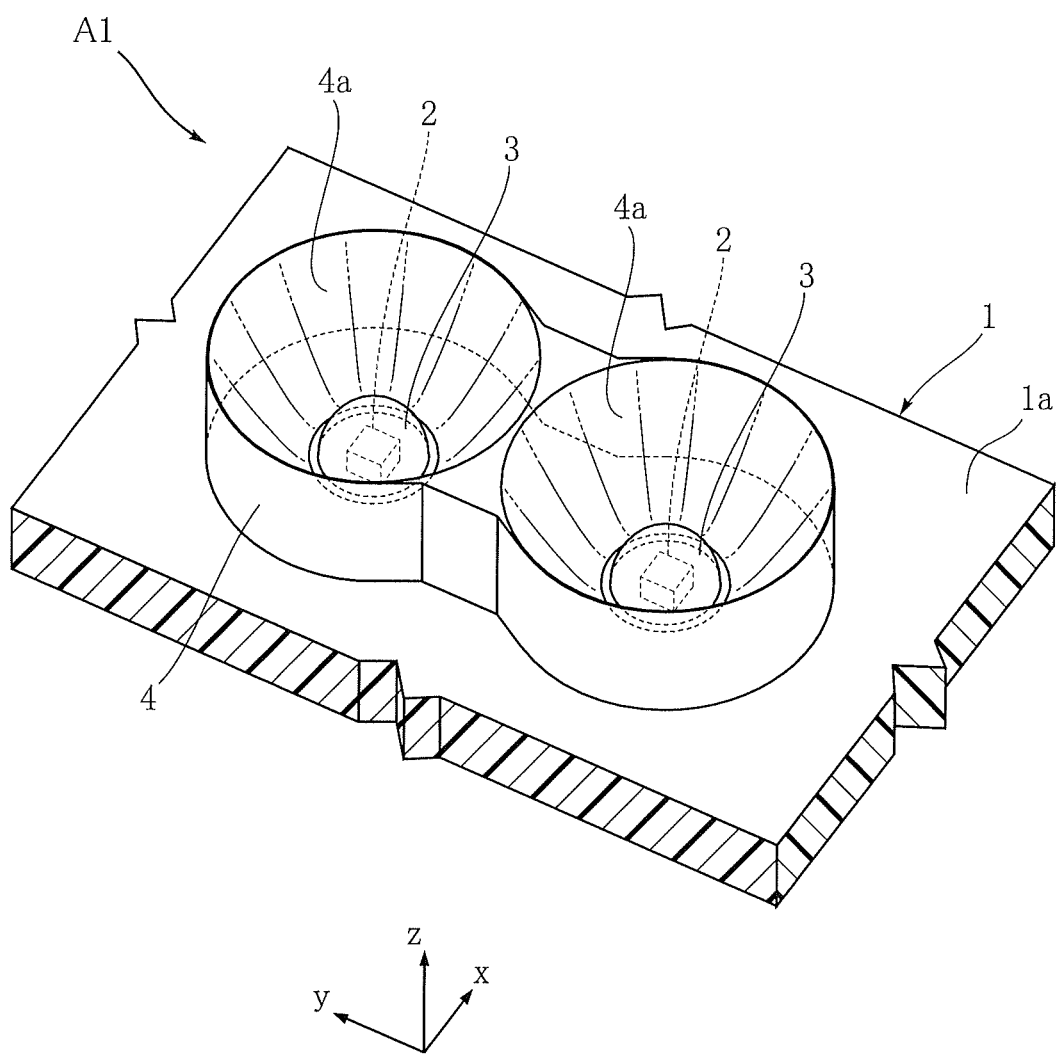
FIG. 4 is a perspective view showing part of the lighting apparatus of FIG. 1.

As shown in FIGS. 4 to 6, each case 4 in this embodiment has two reflecting faces 4a adjacent to each other. Each reflecting face 4a has a ring shape surrounding the corresponding sealing resin member 3. The reflecting face 4a is a concave curved surface, and, in this embodiment, an aspheric surface. The height of the reflecting face 4a (size in the z direction) is larger than that of the sealing resin member 3. As is evident from FIG. 6, an inner rim 4b of the reflecting face 4a is located outside the outer rim 3a of the sealing resin member 3 and apart from the outer rim 3a.

Figure 8:
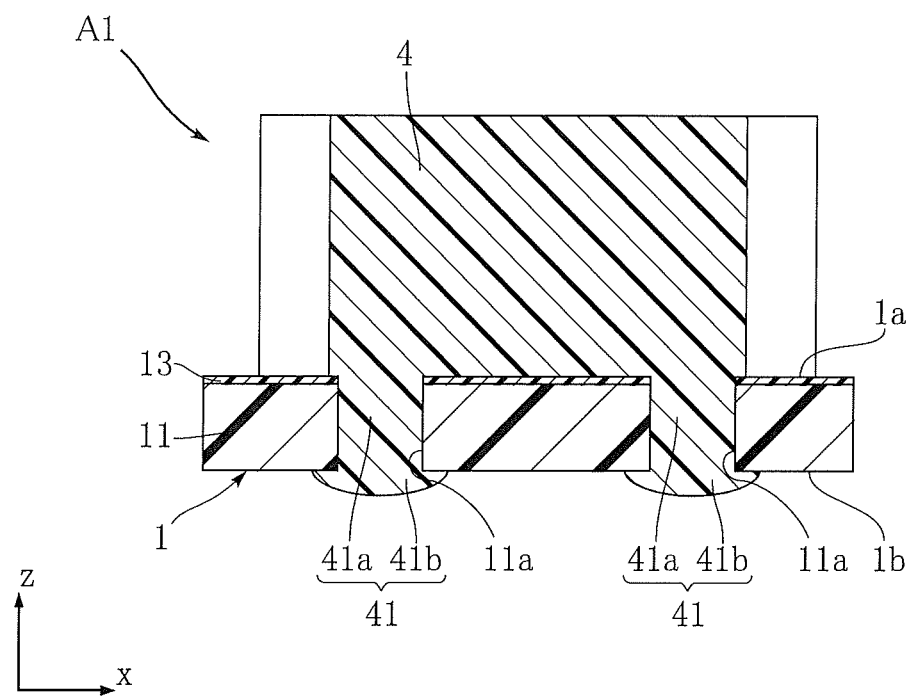
FIG. 8 is a cross-sectional view taken along line VIII-VIII in FIG. 5.

As shown in FIG. 1, the plurality of cases 4 each having two reflecting faces 4a are arranged in correspondence with the plurality of LED chips 2 and the plurality of sealing resin members 3. As shown in FIGS. 5 and 8, two protrusions 41 are formed on each case 4. The two protrusions 41 are placed between the two reflecting faces 4a at positions apart from each other in the direction perpendicular to the direction in which the two reflecting faces 4a are apart. The two protrusions 41 do not overlap either of the two reflecting faces 4a as viewed in the z direction.

Each protrusion 41 engages with a fixing hole 11a formed through the substrate 1, thereby securing the case 4 with respect to the substrate 1. In this embodiment, the protrusion 41 has a fixed-diameter portion 41a and a large-diameter portion 41b larger in diameter than the fixed-diameter portion 41a. The fixed-diameter portion 41a, constituting a root portion of the protrusion 41, fits in through the fixing hole 11a of the substrate 1. The large-diameter portion 41b, constituting a tip portion of the protrusion 41, expands from the reverse surface 1b of the substrate 1. The large-diameter portion 41b is larger in diameter than the diameter of the fixing hole 11a. With the large-diameter portion 41b engaging with the reverse surface 1b, the protrusion 41 is prevented from coming out of the fixing hole 11a. Such a large-diameter portion 41b can be formed, for example, by forming a rod-shaped portion having a fixed diameter on the case 4, inserting the rod-shaped portion through the fixing hole 11a of the substrate 1, and then deforming the tip of the rod-shaped portion by heating (heat caulking). In this embodiment, the case 4 is secured to the substrate 1 with only the two protrusions 41, with no adhesive used.

Figure 9:
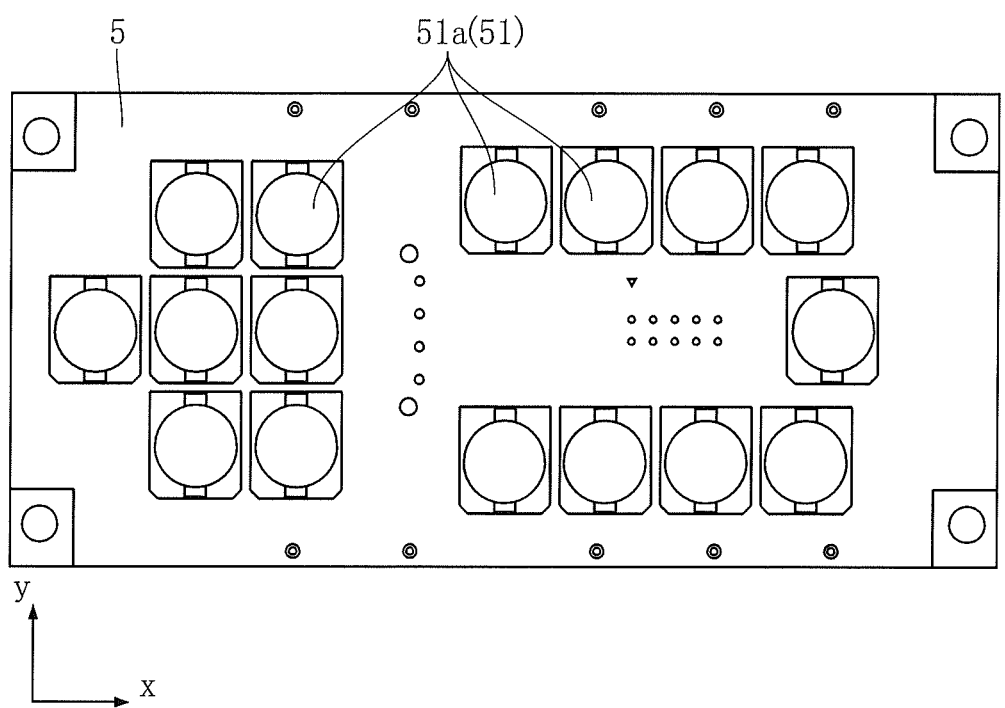
FIG. 9 is a plan view showing an auxiliary substrate of the lighting apparatus of FIG. 1.
Figure 10:
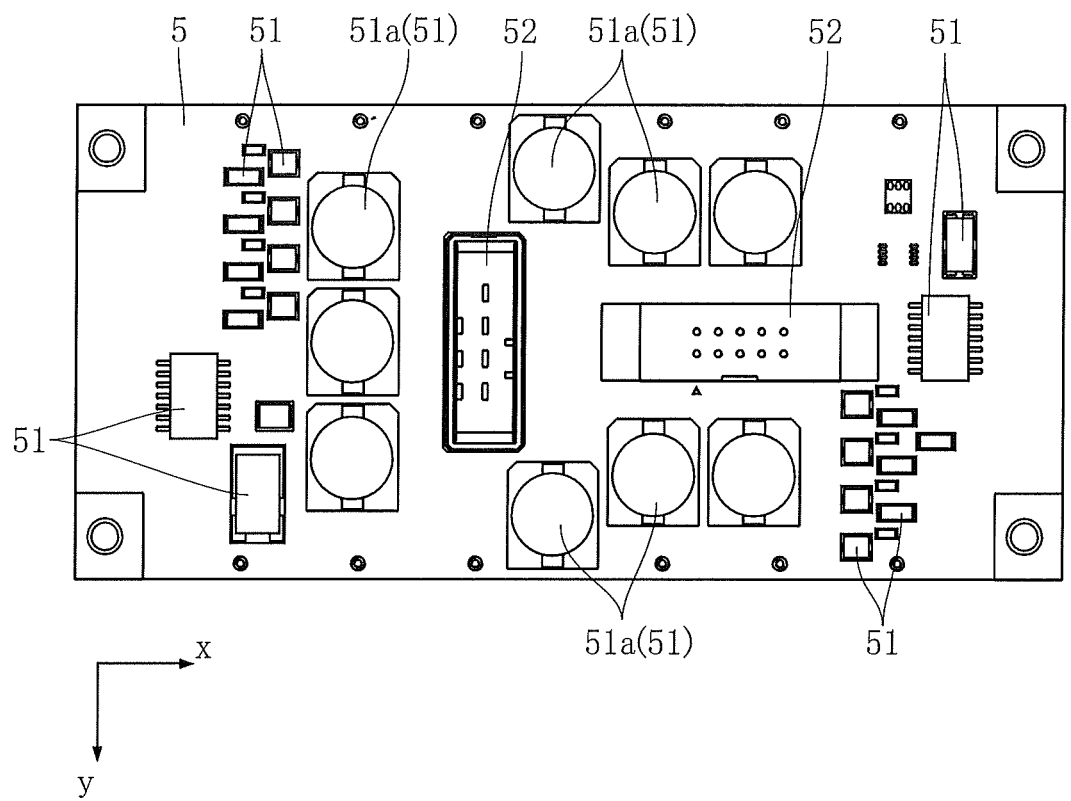
FIG. 10 is a bottom view of the auxiliary substrate shown in FIG. 9.

The auxiliary substrate 5 includes a base made of a glass epoxy resin, for example, and a wiring pattern formed on this base, and a plurality of electronic components 51 and two connectors 52 are mounted on the auxiliary substrate 5. FIG. 9 is a plan view of the auxiliary substrate 5, and FIG. 10 is a bottom view thereof. The auxiliary substrate 5 is placed facing the reverse surface 1b of the LED substrate 1 in this embodiment (see FIG. 2), and is in parallel with the LED substrate 1 in this embodiment. The auxiliary substrate 5 and the LED substrate 1 are coupled to each other with four coupling rods 53. Also, a plurality of conductive rods 54 are attached to the auxiliary substrate 5 and the LED substrate 1. Each conductive rod 54 includes a conductive member made of a metal, and the conductive member may be covered with an insulating coating. The conductive rod 54 connects an appropriate position of the wiring pattern 12 formed on the reverse surface 1b of the LED substrate 1 and an appropriate position of the wiring pattern of the auxiliary substrate 5.

The plurality of electronic components 51 are for activating or lighting up the plurality of LED chips 2, and include ICs for drive control, chip resistors, and diodes, for example. In this embodiment, the plurality of electronic components 51 also include a plurality of capacitors 51a. These capacitors 51a have a function of storing electric power for allowing the plurality of LED chips 2 to emit light with high brightness simultaneously. As shown in FIGS. 2, 3, 9, and 10, part of the plurality of capacitors 51a are mounted on the top surface (surface facing the LED substrate 1) of the auxiliary substrate 5 while the remainder on the bottom surface thereof.

The two connectors 52 are used when the lighting apparatus A1 is incorporated in a main system (e.g., a traffic information system), and mounted on the bottom surface of the auxiliary substrate 5.

The cover 7 is provided to cover the plurality of sealing resin members 3 and the plurality of cases 4, and made of a transparent resin, for example. In FIG. 1, the cover 7 is represented by the two-dot chain line. The cover 7 has a function of protecting the plurality of sealing resin members 3 and the plurality of cases 4. Fine prisms may be formed on the surface of the cover 7 to refract light output from the plurality of LED chips 2 in a specific direction.

Next, the workings of the lighting apparatus A1 will be described.

In the lighting apparatus A1, as shown in FIG. 6, light rays, out of the light emitted from each LED chip 2, travelling upward in the z direction (the direction in which the main surface 1a faces) are output upward from the sealing resin member 3. At this time, with the sealing resin member 3 having a shape of bulging upward in the z direction, the light rays travel in parallel (or roughly in parallel) in the z direction (i.e., the directionality of light is enhanced). As for light rays travelling sideways or obliquely upward from the LED chip 2, they are reflected by the reflecting face 4a after having been output from the sealing resin member 3. Such light rays therefore travel upward in the z direction. In this way, much of the light emitted from the LED chip 2 can be output in a predetermined direction, and thus improvement in the brightness of the lighting apparatus A1 can be achieved.

According to this embodiment, the outer rim 3a of the sealing resin member 3 coincides with the outer rim 12c of the wire bonding pad 12b. This is because the above-described resin material dropped onto the main surface 1a for formation of the sealing resin member 3 is dammed up at the outer rim 12c of the wire bonding pad 12b. That is, according to this embodiment, the liquid resin material is prevented from spreading over the main surface 1a, and thus the sealing resin member 3 can be avoided from taking an inappropriate shape such as a flat shape. The wire bonding pad 12b is shaped to completely surround the die bonding pad 12a, and the outer rim 12c thereof is continuous over the entire periphery of the die bonding pad 12a. This is suitable for finishing of the sealing resin member 3 into a desired shape (e.g., a shape having a smooth curved surface).

In this embodiment, since the upper electrode 21 and the wire bonding pad 12b are connected with the two wires 25, a large current can be supplied to the LED chip 2. This is advantageous for increase in the output of the LED chip 2, i.e., improvement in the brightness of the lighting apparatus A1. Also, with the two wires 25 extending in the opposite directions from the LED chip 2, the sealing resin member 3 having good shape balance can be formed.

In this embodiment, the reflecting face 4a is constituted by the case 4 supported by the substrate 1. Therefore, by simply securing the case 4 to the substrate 1, the reflecting face 4a can be placed at a desired position with respect to the LED chip 2 and the sealing resin member 3. Moreover, having a ring shape as viewed in the z direction and also having an aspheric shape, the reflecting face 4a can reflect light from the LED chip 2 efficiently in the z direction.

In this embodiment, the case 4 is made of a resin member subjected to metal coating. Thus, the case 4 can be easily formed into a desired shape and size. Also, with the metal coating, the reflecting face 4a having a desired reflectivity can be easily formed.

In this embodiment, a plurality of LED chips are mounted on one face of the substrate 1. Thus, the lighting apparatus A1 can be provided as a high-brightness light-source device that emits planar light.

In this embodiment, a plurality of cases 4 that are not coupled mutually are used. Therefore, even if an individual case 4 is thermally deformed at use, this will not cause undue deformation of the substrate 1. Also, each case 4 has two reflecting faces 4a separately surrounding two adjacent LED chips 2. Therefore, since the number of cases 4 can be a half of the total number of LED chips 2, the efficiency of the production process can be enhanced.

In this embodiment, the LED chips 2 are arranged such that each LED chip is located at an apex of a triangle. Thus, planar light with a uniform brightness distribution can be output.

In this embodiment, the case 4 is secured to the substrate 1 by engaging the protrusions 41 with the fixing holes 11a of the substrate 1. This indicates that most of the bottom surface of the case 4 is in contact with the substrate 1 but not secured thereto. Therefore, for example, even if one of the case 4 and the substrate 1 is thermally deformed, the other is prevented from being affected by this. Also, with the protrusions 41 provided between the two reflecting faces 4a adjacent to each other as viewed in the z direction, the case 4 can be secured to the substrate 1 in balance, and increase in the size of the case 4 can be avoided. Moreover, the arrangement of the two protrusions in the direction perpendicular to the direction in which the two adjacent reflecting faces 4a are apart is suitable for securing the case 4 in balance. Since the protrusions 41 do not overlap the reflecting faces 4a as viewed in the z direction, the reflecting faces 4a can be prevented from undue deformation due to heat caulking by which the case 4 is attached to the substrate 1.

In this embodiment, the plurality of LED chips 2 are provided on one surface of the substrate 1, and the auxiliary substrate 5 is secured to the opposite surface thereof. Therefore, light outgoing from the LED chip 2 will not be blocked by the plurality of electronic components 51. Also, by placing the auxiliary substrate 5 with an appropriate spacing from the substrate 1, a desired number of electronic components can be placed on both surfaces of the auxiliary substrate 5. In particular, since the capacitors 51a are needed to allow the plurality of LED chips 2 to emit light with high brightness simultaneously, provision of many capacitors 51a contributes to improvement in the brightness of the lighting apparatus A1. The placement in this embodiment, in which a number of capacitors 51a can be provided on both surfaces of the auxiliary substrate 5, is therefore advantageous in brightness improvement.

FIGS. 11 to 15 show an LED lighting apparatus according to the second embodiment of the invention. In these drawings, the same or similar elements as or to those in the first embodiment described above are denoted by the same reference characters.

Figure 11:
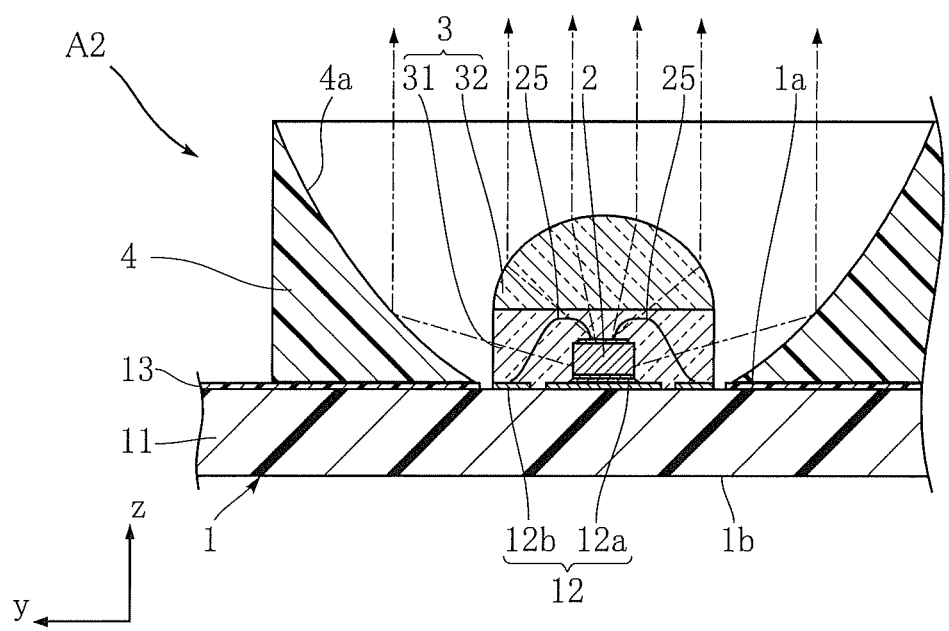
FIG. 11 is a cross-sectional view showing part of an LED lighting apparatus according to the second embodiment of the invention.

As shown in FIG. 11, in the LED lighting apparatus A2 of the second embodiment, the configuration of the sealing resin member 3 is different from that in the above embodiment.

In the second embodiment, the sealing resin member 3 has a columnar portion 31 and a dome portion 32. The columnar portion 31 covers the LED chip 2 and has an axial center extending in the z direction. The transverse cross section (perpendicular to the z direction) of the columnar portion 31 is circular, for example. The dome portion 32 is formed on the top surface of the columnar portion 31 and bulges upward in the z direction.

The columnar portion 31 and the dome portion 32 may be formed of the same material or different materials. Specifically, both the columnar portion 31 and the dome portion 32 may be formed of a transparent resin (e.g., an epoxy resin or a silicone resin). Alternatively, while the columnar portion 31 being formed of a transparent resin, the dome portion 32 may be formed of a material obtained by mixing a fluorescent material into the transparent resin. The fluorescent material outputs light different in wavelength from the light emitted from the LED chip 2 by being excited by the light from the LED chip 2. When the LED chip 2 emits blue light, yellow light may be output from the fluorescent material, for example. As a result, white light is finally output from the lighting apparatus A2.

FIGS. 12 to 15 show an example production method for the lighting apparatus A2.

First, a plurality of LED chips 2 are mounted on the substrate 1 (in FIG. 12, only one LED chip is shown). Two wires 25 are bonded to each LED chip. A sheet S is stuck to the main surface 1a of the substrate 1. The sheet S has a plurality of openings Sa. The openings Sa, formed to correspond to the plurality. of LED chips 2, are each shaped and sized to accommodate one LED chip 2. The thickness of the sheet S is larger than the height (size in the z direction) of the LED chip 2. The thickness of the sheet S is also made larger than the distance between the main surface 1a and the highest position of the wires in the z direction. The sheet S is formed of a fluorocarbon resin, for example, but may be formed of a material other than this.

As shown in FIG. 13, each opening Sa in the sheet S is filled with a liquid resin material using a nozzle Nz, for example. The filling amount of the resin material in the opening Sa is an amount with which at least the LED chip 2 and the two wires 25 are completely covered with the resin material, and preferably an amount with which the surface of the resin material is flush with the top surface of the sheet S. The filled liquid resin material is exposed to heat or UV to harden the resin material, thereby obtaining the columnar portion 31 (see FIG. 11).

As shown in FIG. 14, the sheet S is stripped off from the substrate 1. As shown in FIG. 15, a liquid resin material is dropped onto the top surface of the columnar portion 31 using the nozzle Nz, for example. The drop amount of the resin material at this time is an amount with which the resin material at least covers the entire top surface of the columnar portion 31, and preferably an amount with which the resin material takes a dome shape. The dropped liquid resin material is exposed to heat or UV to harden the resin material, thereby obtaining the dome portion 32. Thereafter, the cases 4, the auxiliary substrate 5, etc. are attached to the LED substrate 1, to obtain the lighting apparatus A2.

Brightness improvement can be achieved also for the lighting apparatus A2. In particular, with the dome portion 32 provided on the columnar portion 31, the distance between the top surface of the sealing resin member 3 and the LED chip 2 can be increased. For sealing resin members 3 whose top surfaces are the same in shape, the directionality will be more enhanced as the distance of the top surface from the LED chip 2 is longer.

Figure 16:
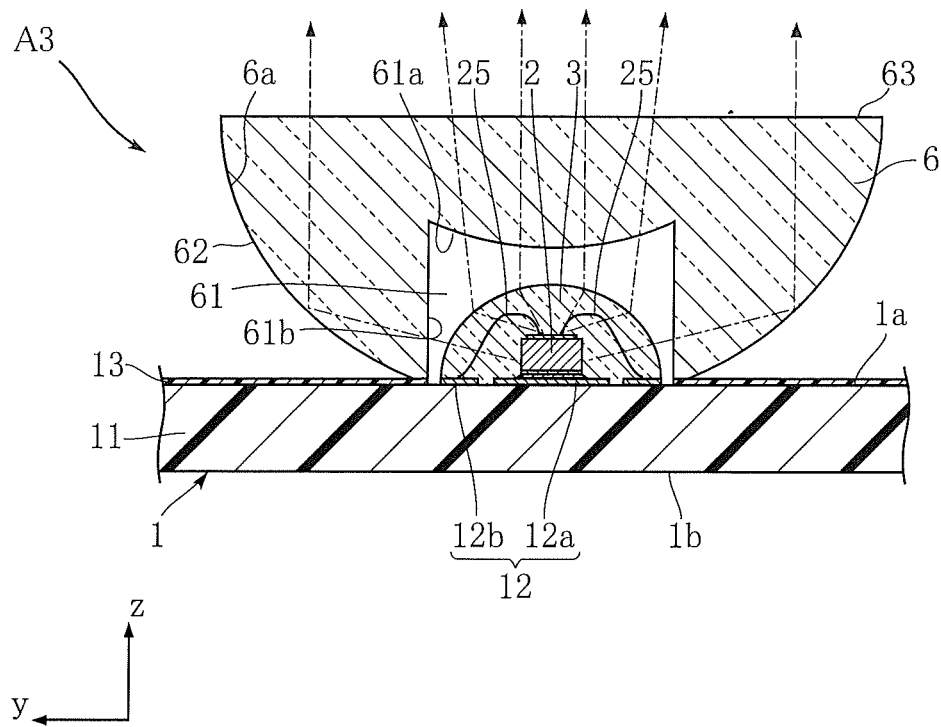
FIG. 16 is a cross-sectional view showing part of an LED lighting apparatus according to the third embodiment of the invention.

FIG. 16 shows an LED lighting apparatus according to the third embodiment of the invention. The lighting apparatus A3 of this embodiment has light guide members 6 in place of the cases 4 in the first and second embodiments described above. In this embodiment, the light guide members 6 are prism lenses, but the invention is not limited to this.

The prism lenses 6 are made of a transparent resin (e.g., acrylic), glass, or the like. Each of the prism lenses 6 has a recess portion 61, an outer side surface 62, and an outgoing surface 63.

The recess portion 61 opens downward and is closed upward (at the bottom of the recess portion). The prism lens 6 is joined to the substrate 1 with an adhesive at the lower rim of the recess portion 61.

The recess portion 61 houses the sealing resin member 3 inside and has a bottom surface 61a and an inner side surface 61b. The bottom surface 61a is located right above the sealing resin member 3 and is larger than the sealing resin member 3 as viewed in the z direction. The bottom surface 61a is circular, for example, as viewed in the z direction, and has a shape of bulging downward. With this shape, the bottom surface 61a functions as a convex lens.

The inner side surface 61b, connecting the lower rim of the recess portion 61 and the bottom surface 61a, is cylindrical in this embodiment. The inner side surface 61b is parallel to the z direction and located slightly outside the sealing resin member 3 as viewed in the z direction.

The outer side surface 62 is a surface extending from the lower end of the prism lens 6 to the upper end thereof. The outer side surface 62 is inclined so that the size of the cross section as viewed in the z direction is larger as the position of the cross section is farther from the substrate 1 in the z direction. Also, the outer side surface 62 a curved surface bulging obliquely downward, and is aspheric in this embodiment. Light travelling laterally from the LED chip 2 passes through the sealing resin member 3 and enters the prism lens 6 at the inner side surface 61b thereof. Thereafter, after being totally reflected by the outer side surface 62, the light travels upward. That is, the outer side surface 62 in this embodiment functions as a reflecting face 6a.

The outgoing surface 63, connected to the upper end of the outer side surface 62, is a circular flat surface vertical to the z direction in this embodiment. Light incident on the bottom surface 61a of the recess portion 61 or light reflected by the reflecting face 6a is output from the outgoing surface 63.

In the lighting apparatus A3, light travelling upward from the LED chip 2 is enhanced in directionality by passing through the top surface of the sealing resin member 3 and the bottom surface 61a of the prism lens 6. Also, since the reflecting face 6a totally reflects light, the brightness will not be decreased.

Figure 17:
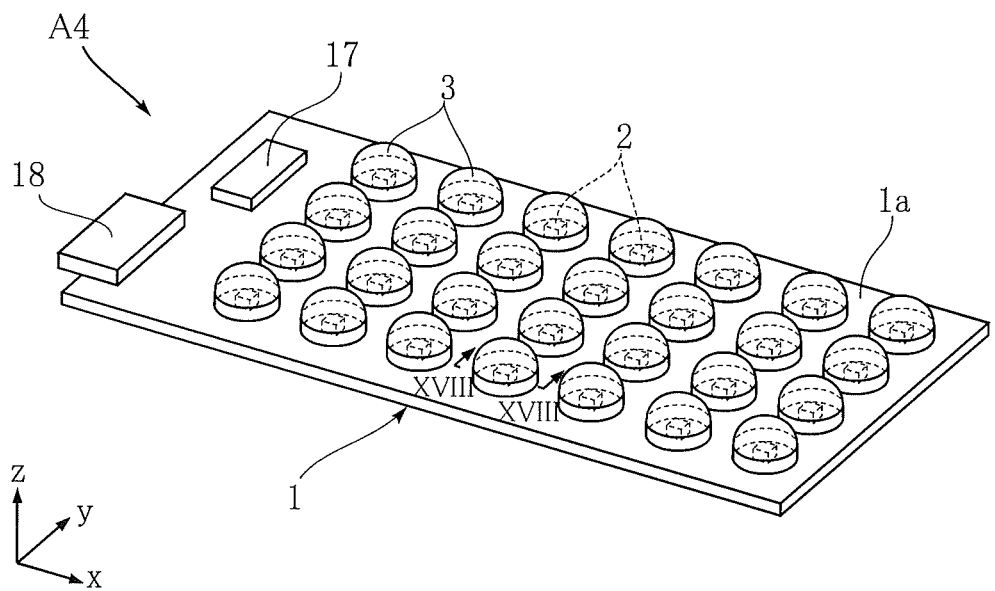
FIG. 17 is a perspective view showing an LED lighting apparatus according to the fourth embodiment of the invention.

FIGS. 17 and 18 show an LED lighting apparatus according to the fourth embodiment of the invention. The LED lighting apparatus A4 of this embodiment includes a substrate (LED substrate) 1, a plurality of LED chips 2, and a plurality of sealing resin members 3. The LED lighting apparatus A4 is used as a light source device for a dot matrix indicator, for example, but the invention is not limited to this.

The substrate 1 supports the plurality of LED chips 2 and also constitutes power supply paths for allowing the LED chips 2 to emit light. The substrate 1 has a main surface 1a and a reverse surface 1b, and includes a base 11 and a wiring pattern 12. The plurality of LED chips 2 are mounted on the main surface 1a.

The base 11 is made of an insulating material, which is, but not specifically limited to, a glass epoxy resin, for example. In this embodiment, the base 11 is formed of a plurality of layers each made of a glass epoxy resin placed on top of one another.

In this embodiment, the wiring pattern 12 is formed on at least the main surface 1a of the base 11, and made of a metal such as Cu, Pd, Ni, and Au. The wiring pattern 12 may be constituted by a single layer, or of a plurality of layers placed on top of one another. For the wiring pattern 12 constituted by a plurality of layers, the layers may be formed of the same metal or different metals (in this embodiment, at least the outermost layer is formed of Au). The wiring pattern 12 includes die bonding pads 12a and wire bonding pads 12b.

The LED chips 2 are die-bonded to the die bonding pads 12a, which are formed on the main surface 1a. The wire bonding pads 12b are formed on the main surface 1a and apart from the die bonding pads 12a.

In this embodiment, a drive IC 17 and a connector 18 are provided on the substrate 1. The drive IC 17 performs control for allowing the plurality of LED chips 2 to emit light. The connector 18 is used for attaching the LED lighting apparatus A4 to a main system, for example. The connector 18 is in conduction with the wiring pattern 12.

The plurality of LED chips 2 are separately die-bonded to the plurality of die bonding pads 12a provided on the main surface 1a of the substrate 1. In this embodiment, the plurality of LED chips 2 are arranged in a matrix.

As shown in FIG. 18, each of the LED chips 2 includes a semiconductor layer 20, two upper electrodes 21, and a sub-mount substrate 24. The semiconductor layer 20 has a structure of an n-type semiconductor layer, an active layer, and a p-type semiconductor layer placed on top of one another. In this embodiment, the semiconductor layer 20 is formed of GaN semiconductors, and the LED chip 2 emits blue light.

The two upper electrodes 21 are formed on the top surface of the semiconductor layer 20. Ends of two wires 25 are bonded to the two upper electrodes 21. The other ends of the wires 25 are bonded to the wire bonding pad 12b. The two wires 25 extend in the opposite directions from the LED chip 2. The sub-mount substrate 24, made of Si, for example, supports the semiconductor layer 20. The sub-mount substrate 24 is secured to the die bonding pad 12a with a joining material 27.

Sealing resin members 3 each cover one corresponding LED chip 2, and are made of a material that transmits light from the LED chip 2. As the material of the sealing resin members 3, a transparent resin (e.g., an epoxy resin or a silicone resin) is used, for example. Otherwise, a material obtained by mixing a fluorescent material into the transparent resin may be used. The fluorescent material emits yellow light by being excited by blue light from the LED chip 2. Having the above configuration, the LED lighting apparatus A4 finally emits white light. Alternatively, the fluorescent material may be one that emits red light or green light by being excited by blue light.

In the LED lighting apparatus A4 of this embodiment, a plurality of LED chips 2 may be covered with one sealing resin member 3. It is preferable that such LED chips 2 emit light of different wavelengths from one another, such as red light, blue light, and green light. This will make it possible for the LED lighting apparatus A4 to output a plurality of kinds of light different in color in each pixel.

The sealing resin member 3 includes a columnar portion 31 and a dome portion 32. The columnar portion 31 is in a shape of a column having an axial center extending in the z direction, and its cross section is circular, for example. The columnar portion 31 is in contact with the main surface 1a of the substrate 1, and covers the LED chip 2 and the two wires 25. The dome portion 32 is formed on the top surface of the columnar portion 31 and has an upwardly bulging shape. In this embodiment, the dome portion 32 is hemispherical.

In this embodiment, the top surface of the columnar portion 31 is not flat but slightly recessed downward. The bottom surface of the dome portion 32 is in close contact with the top surface of the columnar portion 31. That is, the bottom surface of the dome portion 32 is not flat but slightly protrudes downward. At the interface between the columnar portion 31 and the dome portion 32, the outer rims of the columnar portion 31 and the dome portion 32 completely coincide with each other. Specifically, the outer rim 31a of the top surface of the columnar portion 31 and the outer rim 32a of the bottom surface of the dome portion 32 completely coincide with each other. The angle (see angle θ in FIG. 18) formed between the top surface of the columnar portion 31 (or the bottom surface of the dome portion 32) and the side surface of the columnar portion 31 is acute (slightly smaller than the right angle in this embodiment). The heights of the columnar portion 31 and the dome portion 32 are each about 1 mm, for example.

The surface roughness (e.g., arithmetic mean roughness) of the exposed surface (i.e., side surface) of the columnar portion 31 is larger than that of the exposed surface (i.e., semispherical curved surface) of the dome portion 32. This difference in surface roughness is caused by the production method for the LED lighting apparatus A4 (described below).

FIGS. 19 to 22 show an example production method for the LED lighting apparatus A4.

Figure 19:
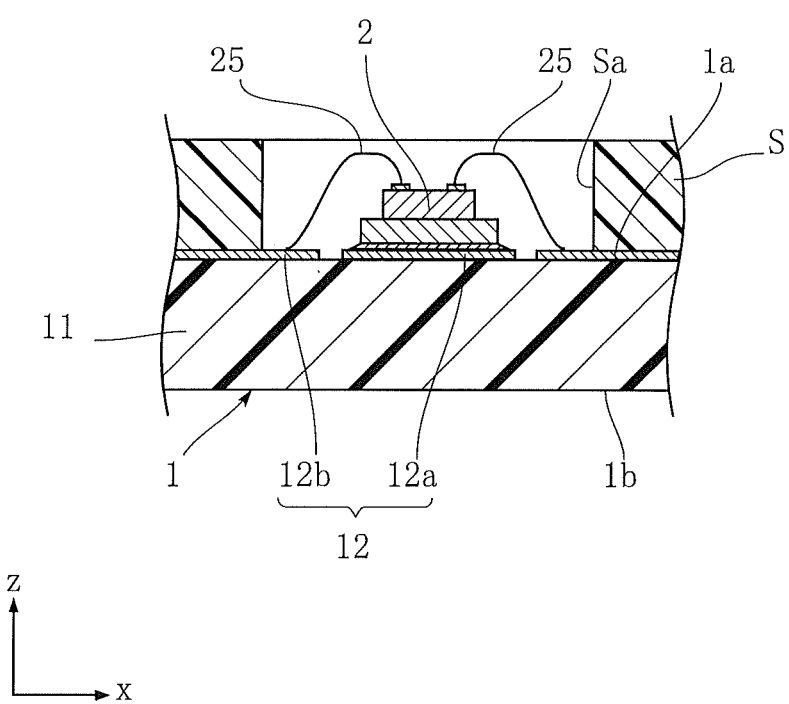
FIG. 19 is a cross-sectional view showing a process step of a production method for the LED lighting apparatus of FIG. 17.

First, a plurality of LED chips 2 are mounted on the substrate 1, and two wires 25 are bonded to each chip (only one LED chip is shown in FIG. 19). A sheet S is then stuck to the main surface 1a of the substrate 1. The sheet S has a plurality of openings Sa. The openings Sa are each shaped, sized, and positioned to accommodate one corresponding LED chip 2. As shown in FIG. 19, the height of the opening Sa (the thickness of the sheet S) is set so that the LED chip 2 and the two wires 25 are completely housed in the inside of the opening Sa. The sheet S is made of a fluorocarbon resin, for example, but the invention is not limited to this.

Figure 20:
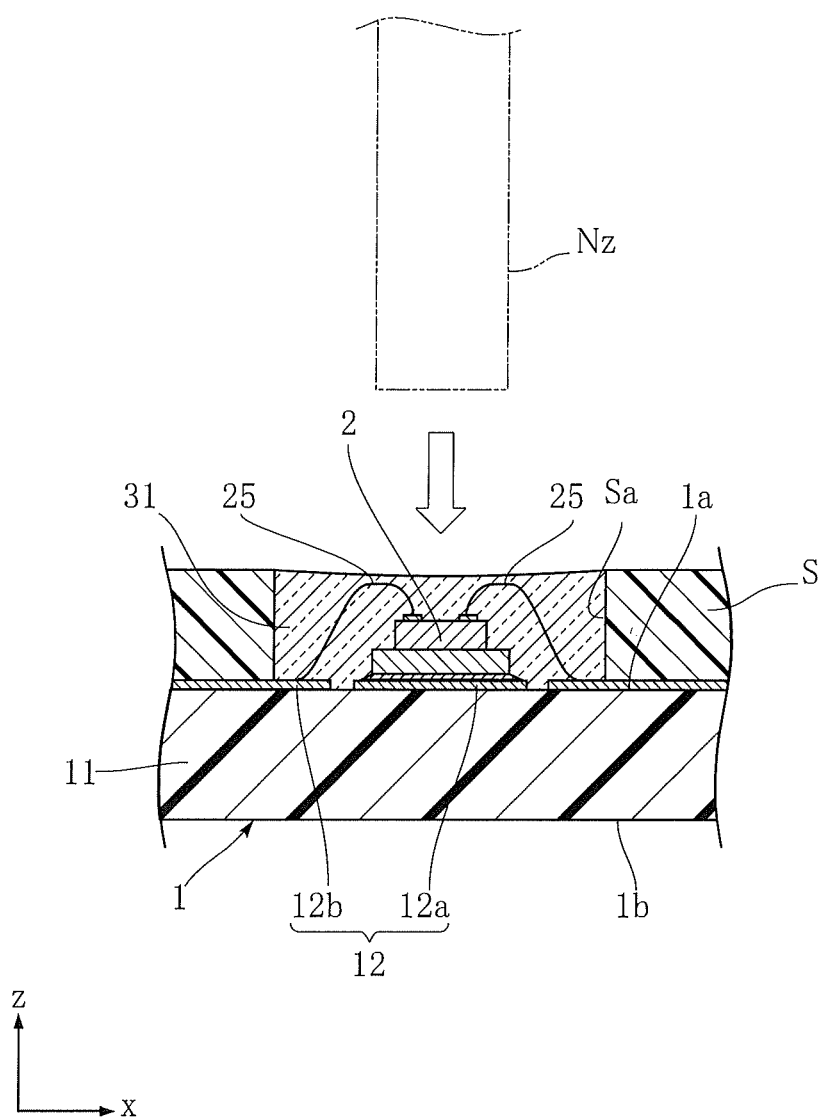
FIG. 20 is a cross-sectional view showing another process step of the production method for the LED lighting apparatus of FIG. 17.

Thereafter, as shown in FIG. 20, each opening Sa of the sheet S is filled with a liquid resin material using a nozzle Nz, etc. The filling amount of the resin material is set to an amount with which at least the LED chip 2 and the two wires 25 are covered with the resin material, and preferably an amount with which the surface of the resin material is in contact with the top end of the sheet S. Note however that, in order to avoid an overflow of the resin material from the opening Sa, an amount with which the surface of the resin material is slightly curved inward as illustrated is preferred.

The filled resin material is exposed to heat or UV to harden the resin material, thereby obtaining the columnar portion 31.

Figure 21:
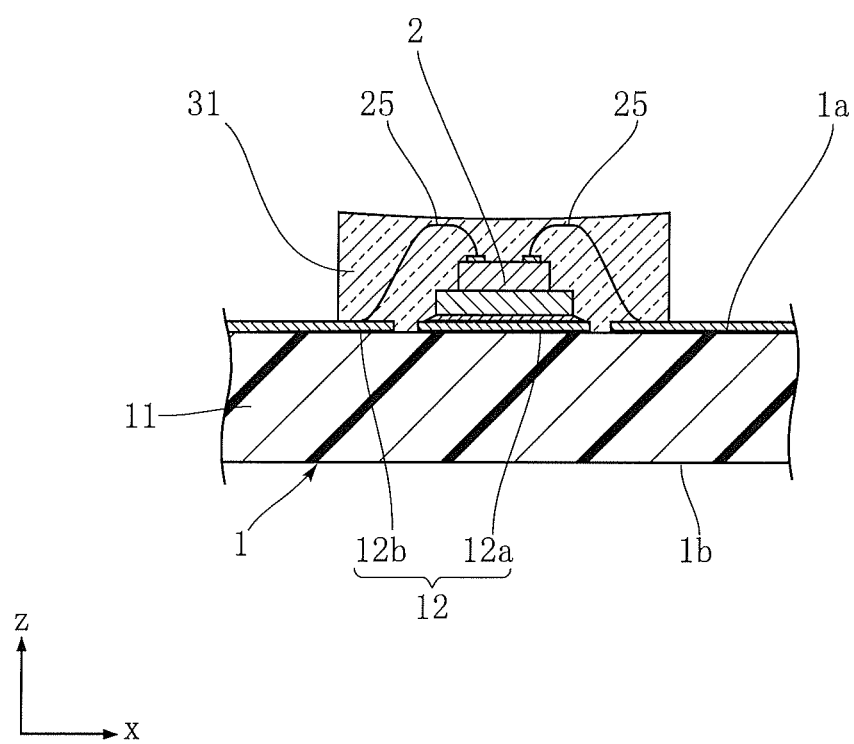
FIG. 21 is a cross-sectional view showing yet another process step of the production method for the LED lighting apparatus of FIG. 17.

Subsequently, as shown in FIG. 21, the sheet S is removed from the substrate 1. The side surface of the columnar portion 31 is constituted by the inner side surface of the opening Sa of the sheet S, and thus the surface roughness of the side surface of the columnar portion 31 depends on the surface roughness of the opening Sa. The opening Sa is formed by punching, for example. Therefore, the inner side surface of the opening Sa is rough compared with a smooth liquid surface formed by surface tension, for example, and the side surface of the columnar portion 31 has similar roughness.

Figure 22:
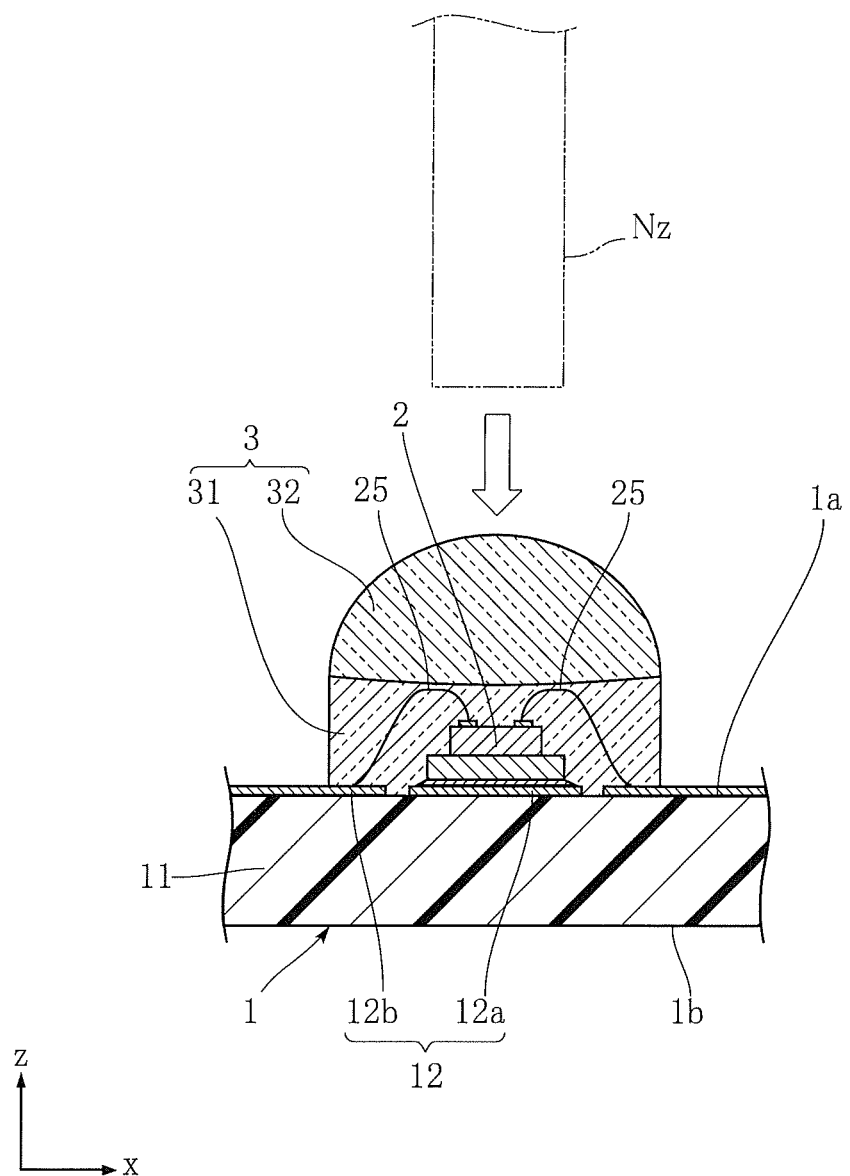
FIG. 22 is a cross-sectional view showing yet another process step of the production method for the LED lighting apparatus of FIG. 17.

Subsequently, as shown in FIG. 22, a liquid resin material is dropped onto the top surface of the columnar portion 31 using a nozzle Nz, etc. The drop amount of the resin material at this time is an amount with which the resin material covers at least the entire top surface of the columnar portion 31, and preferably an amount with which the resin material takes a dome shape. The resin material is exposed to heat or UV to harden the resin material, thereby obtaining the dome portion 32. The surface of the dome portion 32 is smooth compared with the side surface of the columnar portion 31.

Next, the workings of the LED lighting apparatus A4 will be described.

In the LED lighting apparatus A4, with the dome portion 32 provided on the columnar portion 31, the distance between the top surface of the sealing resin member 3 and the LED chip 2 can be increased. For sealing resin members 3 whose top surfaces are the same in shape, the directionality can be more enhanced as the distance of the top surface from the LED chip 2 is longer.

While contributing to increase in the height of the sealing resin member 3, the columnar portion 31 does not increase the size of the sealing resin member 3 as viewed in the z direction. It is therefore possible to make the LED lighting apparatus A4 compact while achieving improvement in the brightness of the LED lighting apparatus A4.

The columnar portion 31 has a size large enough to cover the entire LED chip 2 and the entire wires 25. Therefore, at the formation of the dome portion 32, the shape of the dome portion 32 is prevented from becoming deformed due to the LED chip 2 and the wires 25.

The top surface of the columnar portion 31 is not flat but slightly recessed downward. The bottom surface of the dome portion 32 is in close contact with the top surface of the columnar portion 31. That is, the bottom surface of the dome portion 32 is not flat but slightly protrudes downward. At the interface between the columnar portion 31 and the dome portion 32, the outer rims of the columnar portion 31 and the dome portion 32 coincide with each other. Specifically, the outer rim 31a of the top surface of the columnar portion 31 and the outer rim 32a of the bottom surface of the dome portion 32 coincide with each other. The reason is that, as shown in FIG. 22, with the outer rim 31a of the columnar portion 31, the dropped resin material is prevented from spreading beyond the outer rim 31a at the formation of the dome portion 32. Using such a technique, the dome portion 32 can be made to bulge in the z direction without fail and also prevented from unduly spreading laterally beyond the columnar portion 31.

Since the angle θ (see FIG. 18) formed between the interface between the columnar portion 31 and the dome portion 32 and the side surface of the columnar portion 31 is acute, the resin material can be made to stay on the top surface of the columnar portion 31 by surface tension at the formation of the dome portion 32. This contributes to formation of the upwardly bulging shape of the dome portion 32, and eventually to improvement in the brightness of the LED lighting apparatus A4.

Figure 23:
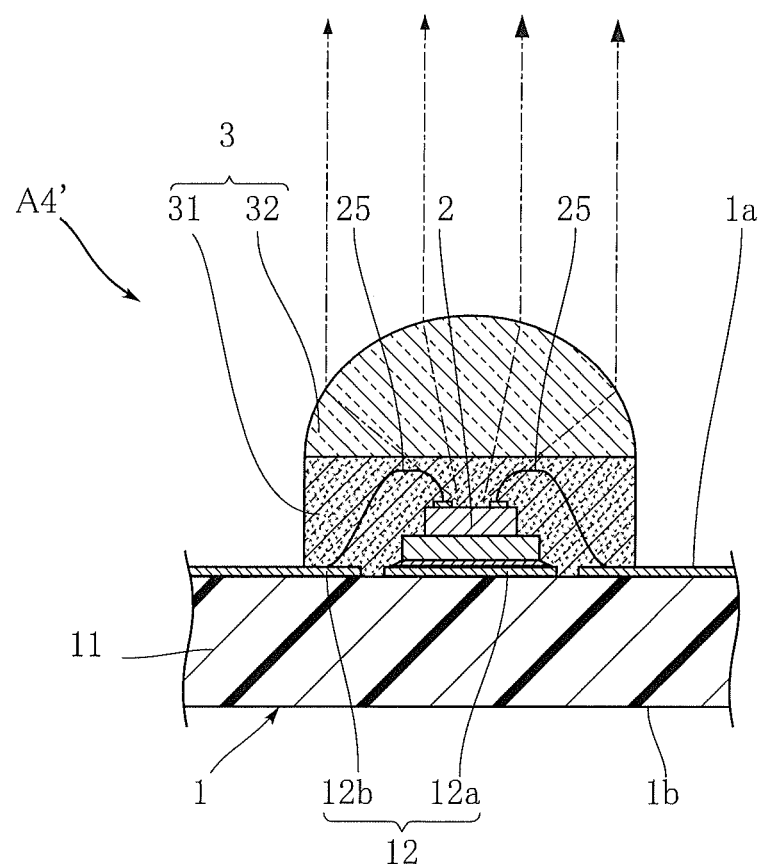
FIG. 23 is a cross-sectional view showing an alteration of the LED lighting apparatus of FIG. 17.
Figure 24:
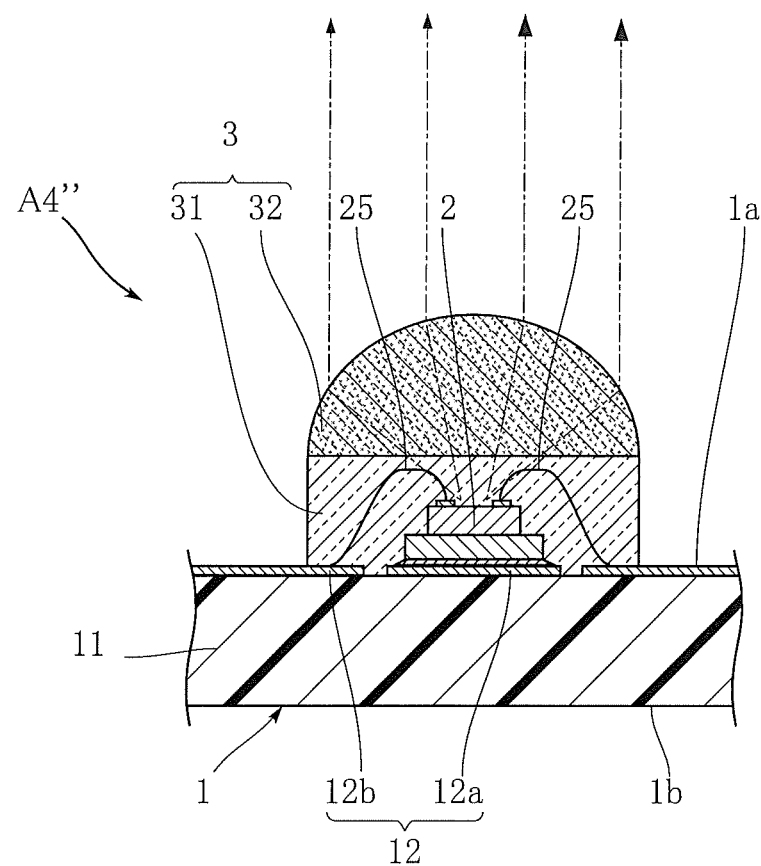
FIG. 24 is a cross-sectional view showing another alteration of the LED lighting apparatus of FIG. 17.

FIGS. 23 and 24 show two alterations of the LED lighting apparatus A4.

In an LED lighting apparatus A4' shown in FIG. 23, the columnar portion 31 includes the above-described fluorescent material, but the dome portion 32 includes no fluorescent material and is transparent. In contrast to this, in the alteration shown in FIG. 24, only the dome portion 32 includes the above-described fluorescent material, and the columnar portion 31 includes no fluorescent material and is transparent.

As described above, the sealing resin member 3 may be configured to entirely include a fluorescent material, or partly include it (as in the alterations shown in FIGS. 23 and 24).

Figure 25:
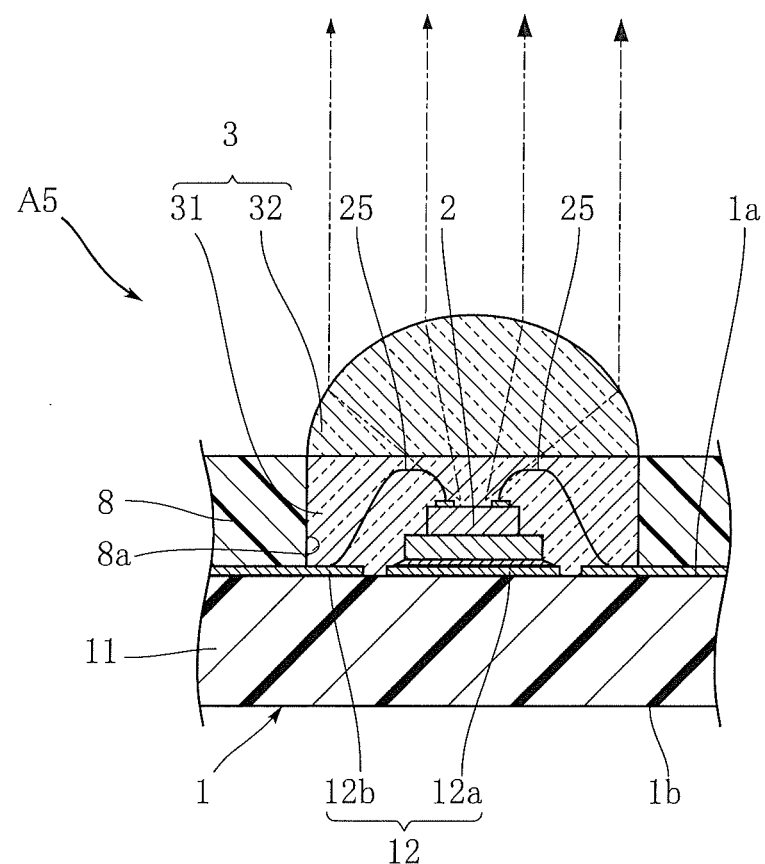
FIG. 25 is a cross-sectional view showing an LED lighting apparatus according to the fifth embodiment of the invention.

FIG. 25 shows an LED lighting apparatus according to the fifth embodiment of the invention. The LED lighting apparatus A5 of this embodiment is different from the above-described embodiments in having a shading layer 8. The shading layer 8 is joined to the main surface 1a of the substrate 1 and has a plurality of openings 8a (only one opening is shown in FIG. 25). The opening 8a houses the columnar portion 31 of the sealing resin member 3.

Such a shading layer 8 is provided by leaving the sheet S shown in FIG. 20 behind in its state of being joined to the substrate 1, for example. In this case, it is preferable that the sheet S be opaque. The dropping of the resin material as shown in FIG. 22 is performed with the sheet S kept joined to the substrate 1.

In this embodiment, having the shading layer 8, light leakage from the side surface of the columnar portion 31 is prevented. Also, since the trouble of removing the sheet S used for formation of the columnar portion 31 is saved, the LED lighting apparatus A5 can be produced efficiently.

The shading layer 8 is not limited to the configuration described above. For example, after the process steps shown in FIGS. 19 to 22, gaps between any adjacent columnar portions 31 may be filled with an opaque liquid resin (e.g., a white resin), and the resin is then hardened, to form the shading layer 8.

Figure 26:
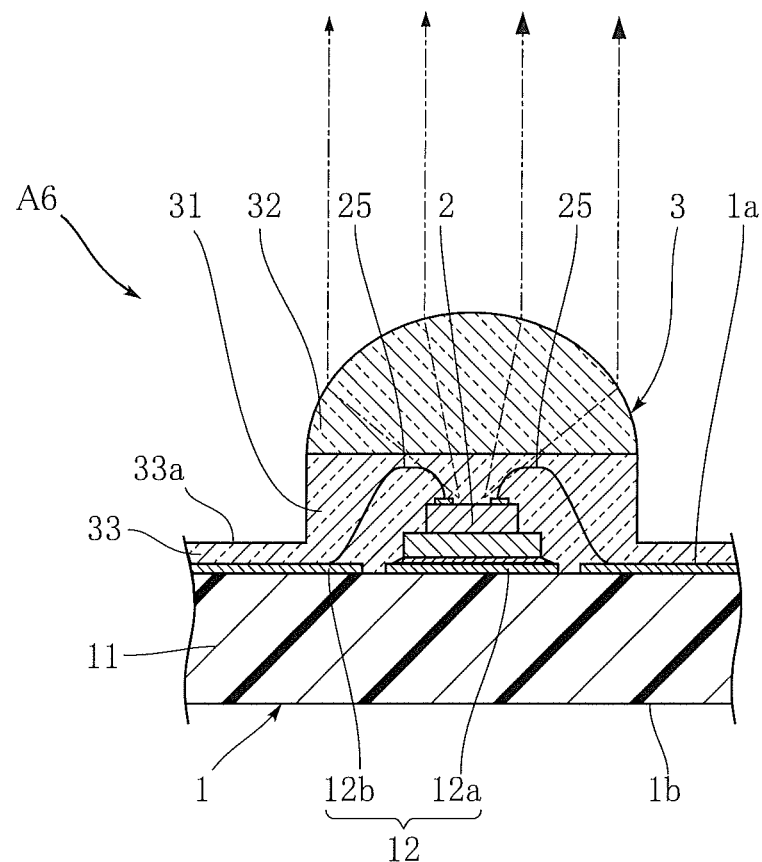
FIG. 26 is a cross-sectional view showing an LED lighting apparatus according to the sixth embodiment of the invention.

FIG. 26 shows an LED lighting apparatus according to the sixth embodiment of the invention. In the LED lighting apparatus. A6 of this embodiment, the sealing resin member 3 has a coupling base layer 33. The coupling base layer 33 covers most of the main surface 1a of the substrate 1 and also covers the plurality of LED chips 2. A groove 33a is formed in the coupling base layer 3. Portions of the coupling base layer 33 separated from one another by the groove 33a constitute the plurality of columnar portions 31.

Figure 27:
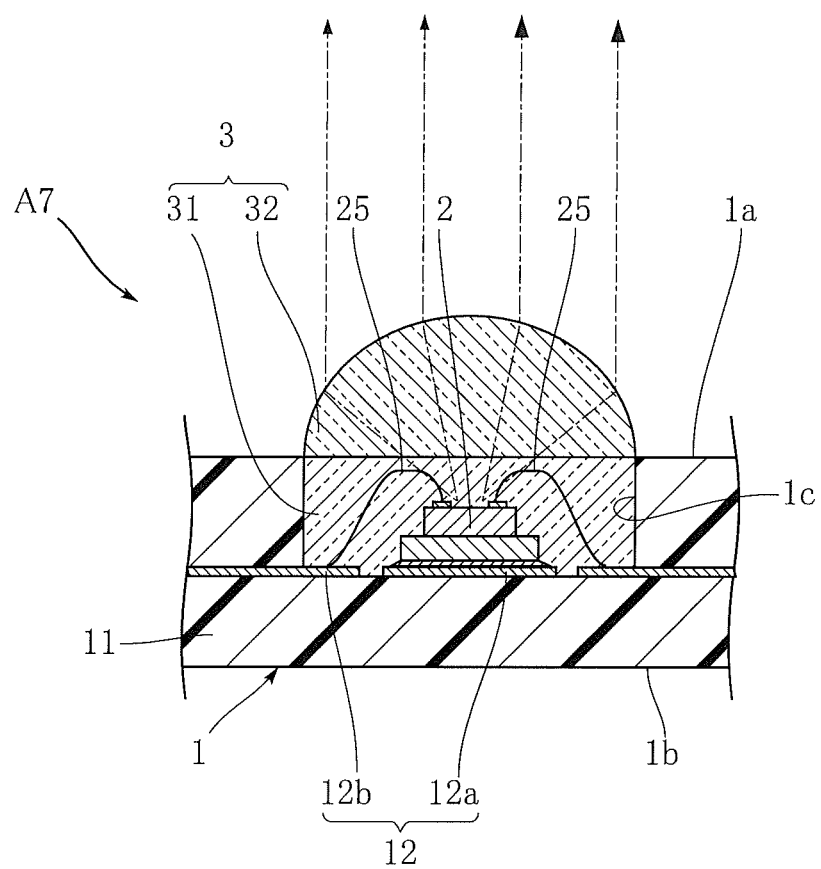
FIG. 27 is a cross-sectional view showing an LED lighting apparatus according to the seventh embodiment of the invention.

FIG. 27 shows an LED lighting apparatus according to the seventh embodiment of the invention. In the LED lighting apparatus A7 of this embodiment, a plurality of recess portions 1c are formed on the substrate 1 (only one recess portion is formed in FIG. 27). The recess portion 1c has a circular cross section and houses the LED chip 2, the two wires 25, and the columnar portion 31.

The substrate 1 is obtained in the following manner, for example: the base 11 is formed as a laminated body of a plurality of layers, and the wiring pattern 12 is formed inside the base 11. An opening is provided through a layer of the base 11 constituting the main surface 1a, to obtain the recess portion 1c. The wiring pattern 12 is formed on the top surface of a layer of the base 11 constituting the reverse surface 1b. As shown in FIG. 27, the die bonding pad 12a and the wire bonding pad 12b are located on the bottom of the recess portion 1c.

The LED chip 2 is die-bonded to the die bonding pad 12a, and the two wires 25 are bonded to the LED chip 2. Thereafter, the recess portion 1c is filled with a liquid resin material. By hardening the filled resin material, the columnar portion 31 is obtained. A resin material is dropped onto the top surface of the columnar portion 31 and then hardened, to obtain the dome portion 32.

FIGS. 28 to 34 show an LED lighting apparatus according to the eighth embodiment of the invention. The LED lighting apparatus A8 of this embodiment includes a substrate 1, a plurality of LED chip 2, a plurality of sealing resin members 3, a plurality of cases 4, an auxiliary substrate 5, and a cover 7.

Figure 33:
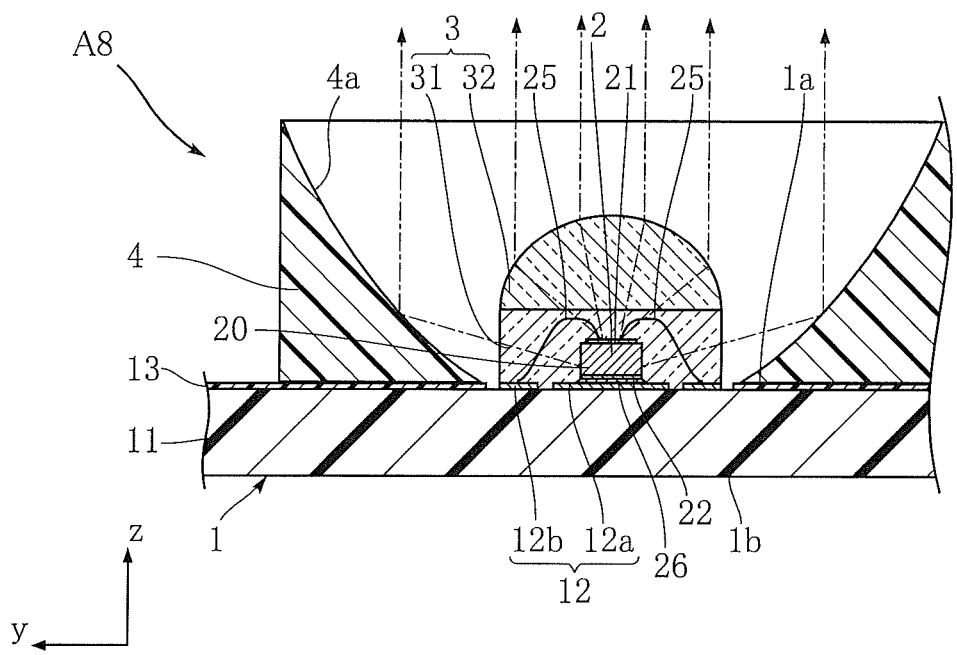
FIG. 33 is a cross-sectional view taken along line XXXIII-XXXIII in FIG. 32.

The substrate 1 supports the plurality of LED chips 2, and has power supply paths for allowing the plurality of LED chips 2 to emit light. Specifically, as shown in FIG. 33, the substrate 1 has a base 11 and a wiring pattern 12. The plurality of LED chips 2 are mounted on a main surface 1a of the base 11.

The size of the substrate 1 is about 116 mm in the x direction and about 55 mm in the y direction, for example. The size of the substrate 1 in the z direction is 0.5 mm to 1.5 mm, for example: it is about 1.0 mm, for example.

The base 11 is made of an insulating material. In this embodiment, the base 11 is a laminated body having a plurality of layers, and each layer is made of a glass epoxy resin, for example.

The wiring pattern 12 is formed on the main surface 1a and reverse surface 1b of the base 11 and inside the base 11. The wiring pattern 12 may have a single-layer structure made of a metal such as Cu, Pd, Ni, and Au, or have a laminated structure of a plurality of layers. For the wiring pattern 12 having a laminated structure, it is preferable that the surface layer be made of Au. The wiring pattern 12 has a plurality of die bonding pads 12a and a plurality of wire bonding pads 12b formed on the main surface 1a of the base 11. As will be described later, the die bonding pads 12a are arranged such that each die bonding pad is located at an apex of a triangle.

A resist layer 13 is formed on the main surface 1a. The resist layer 13, made of an insulating resin, has a plurality of circular openings for exposing the die bonding pads 12a and the wire bonding pads 12b. The diameter of the openings is about 2.9 mm, for example.

The plurality of LED chips 2 are separately die-bonded to the plurality of die bonding pads 12a of the wiring pattern 12 on the main surface 1a of the substrate 1. In this embodiment, as will be understood from FIG. 28, the plurality of LED chips 2 are arranged such that each LED chip is located at an apex of a triangle. The length of one side of the triangle is about 8.0 mm, for example.

As shown in FIG. 33, each LED chip 2 has a semiconductor layer 20, an upper electrode 21, and a lower electrode 22. The semiconductor layer 20 has a structure of an n-type semiconductor layer, an active layer, and a p-type semiconductor layer placed on top of one another. In this embodiment, the semiconductor layer 20 is made of an AlInGaNp semiconductor and a GaAs semiconductor, for example, so that the LED chip 2 emits infrared light.

The upper electrode 21 is formed on the top surface of the semiconductor layer 20. Ends of two wires 25 are bonded to the upper electrode 21. The other ends of the two wires 25 are bonded to the wire bonding pad 12b. These wires 25 extend in the opposite directions from the LED chip 2. The lower electrode 22 is formed on the bottom surface of the semiconductor layer 20 and joined to the die bonding pad 12a with a conductive joining material 26.

The plurality of sealing resin members 3, each covering one corresponding LED chip 2, are made of a transparent material (e.g., an epoxy resin or a silicone resin) that transmits light from the LED chips 2. Each sealing resin member 3 also covers the two wires 25.

Figure 31:
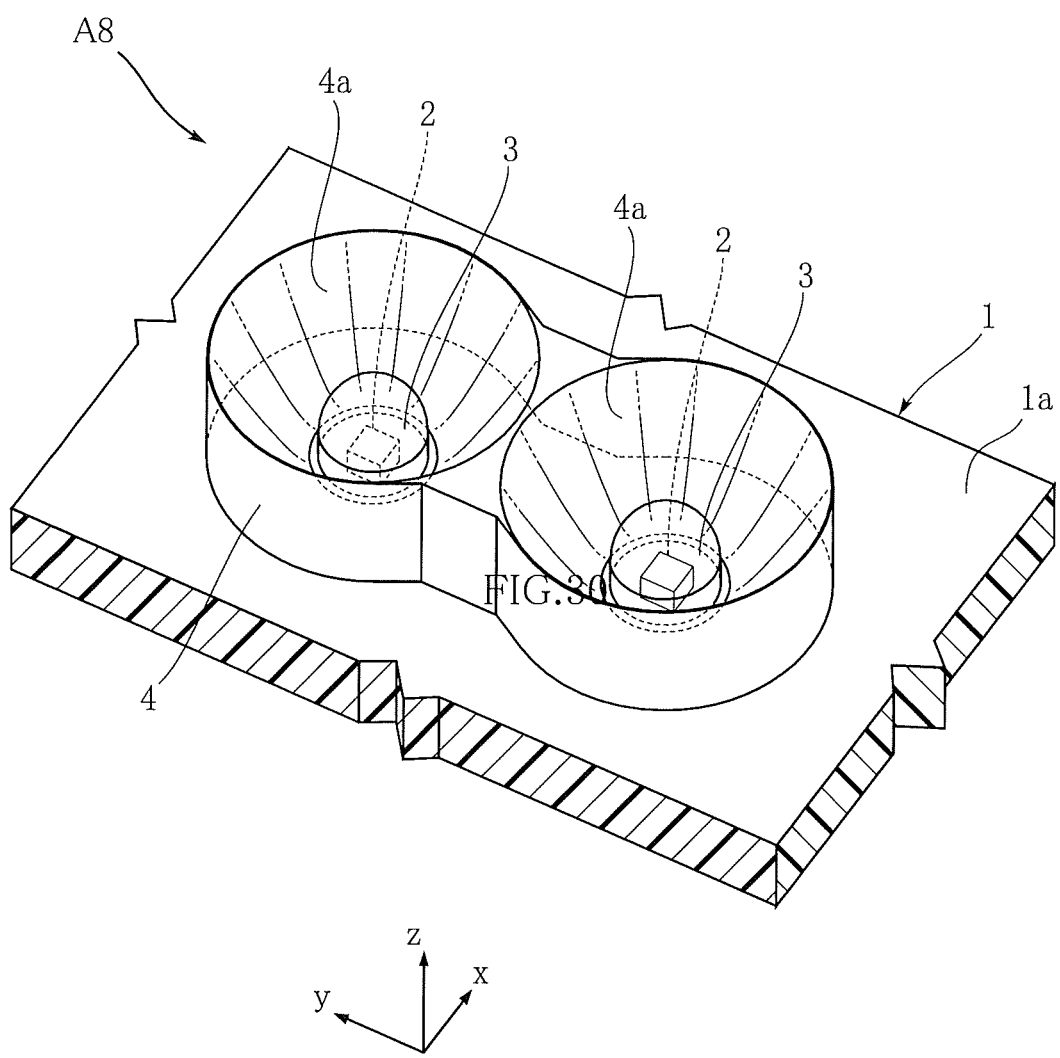
FIG. 31 is a perspective view showing part of the LED lighting apparatus of FIG. 28.
Figure 32:
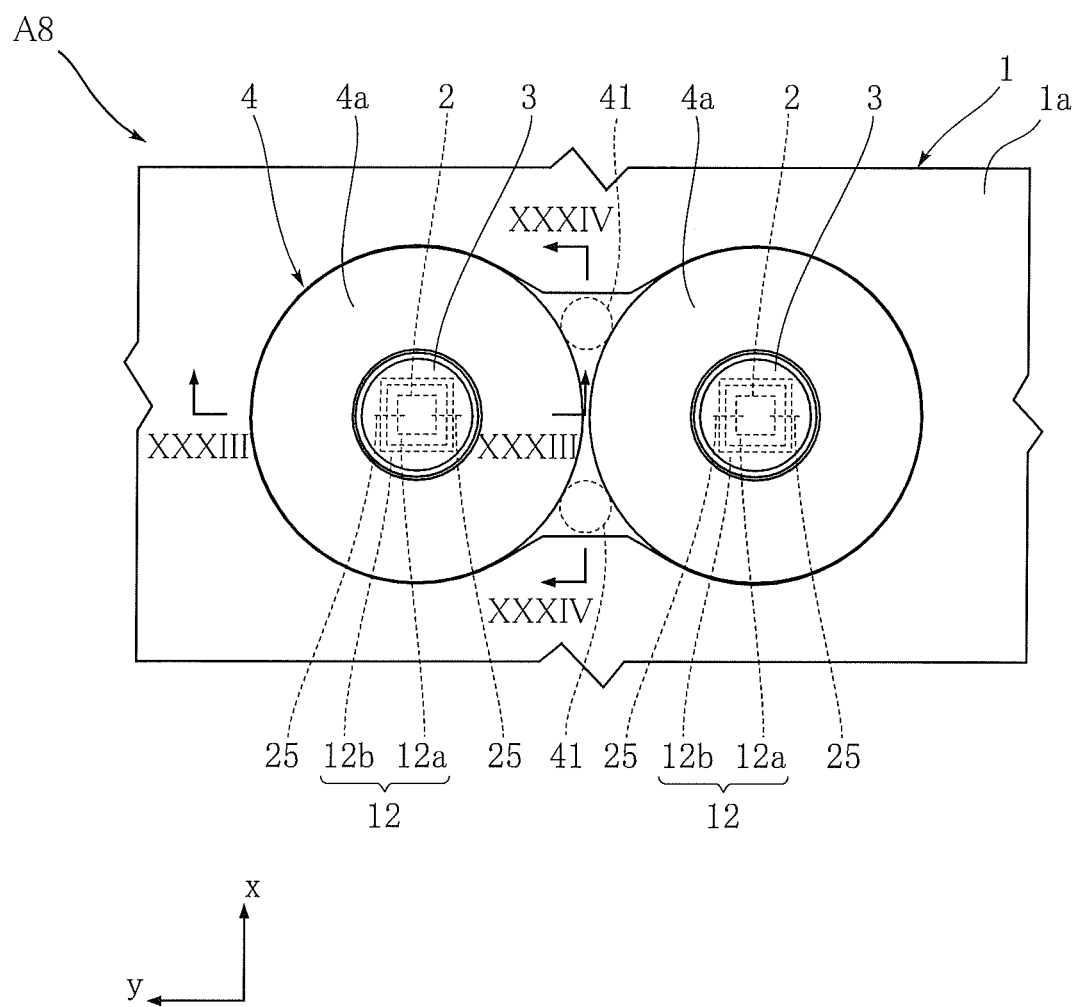
FIG. 32 is a plan view showing part of the LED lighting apparatus of FIG. 28.

The cases 4 are provided for reflecting part of light emitted from the LED chips 2 upward in the z direction. In this embodiment, the cases 4 are formed by applying Al evaporation coating to a white polycarbonate resin, for example. The invention is however not limited to this. If a sufficient reflectivity is secured, the cases may be formed of only a white resin or only a metal, for example. As shown in FIGS. 31 to 33, each case 4 has two reflecting faces 4a adjacent to each other. Each reflecting face 4a has a ring shape surrounding the corresponding sealing resin member 3. The reflecting face 4a is a concave curved surface, and, in this embodiment, an aspheric surface. As shown in FIG. 33, the reflecting face 4a is larger in height than the sealing resin member 3.

Figure 28:
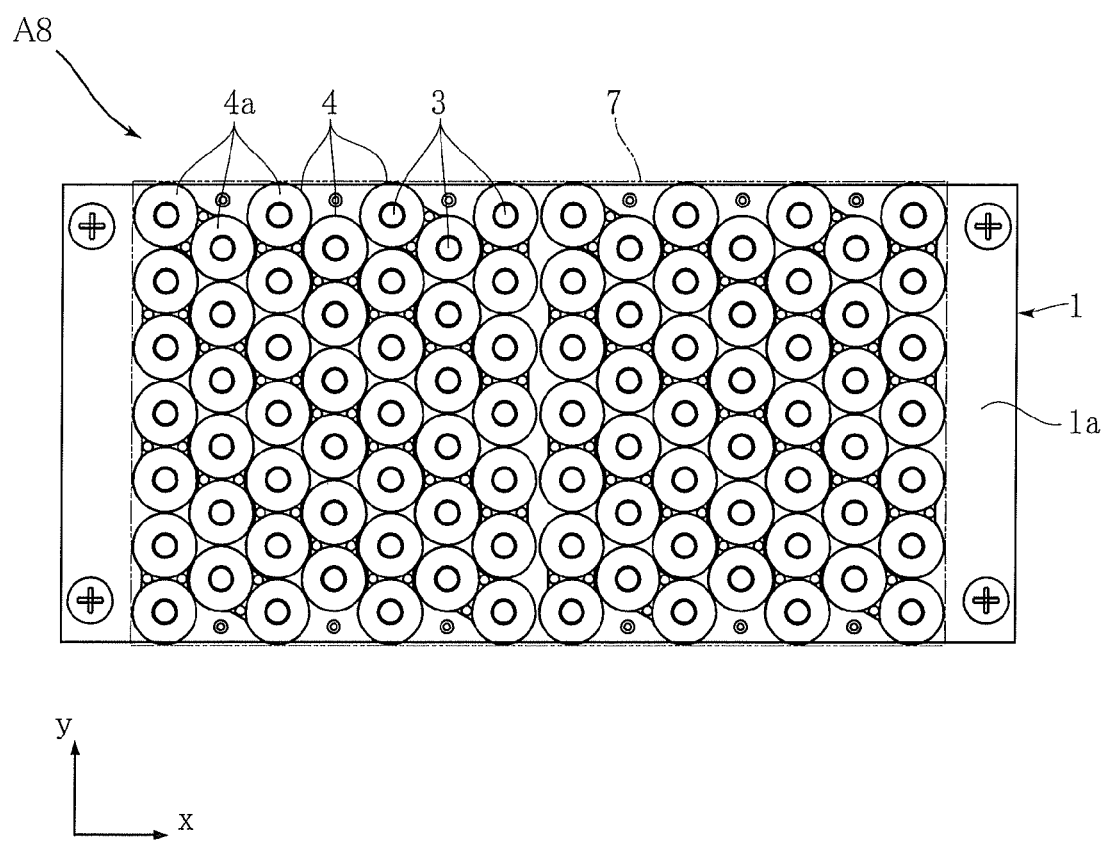
FIG. 28 is a plan view showing an LED lighting apparatus according to the eighth embodiment of the invention.
Figure 34:
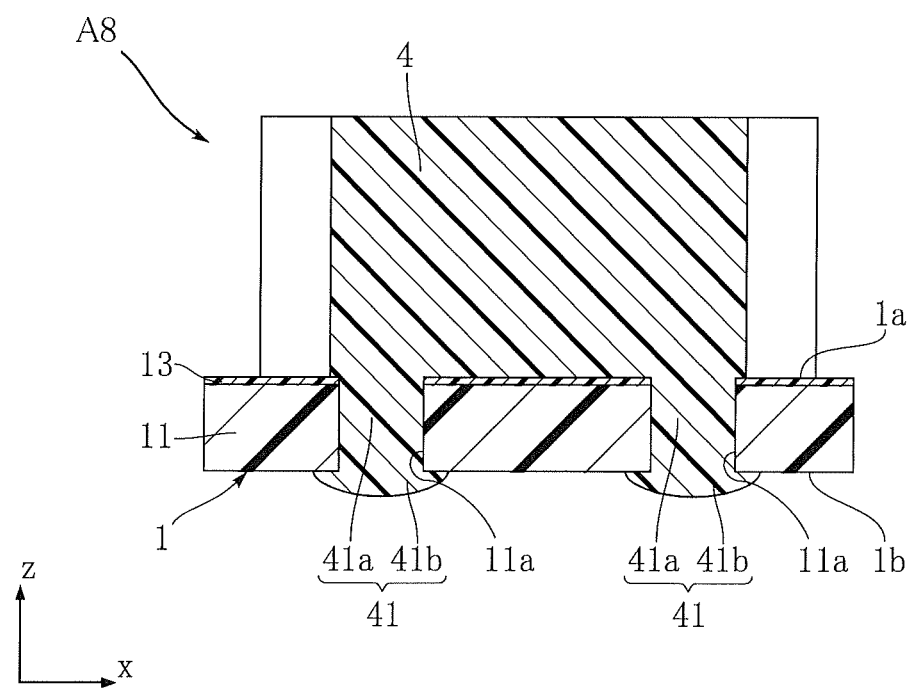
FIG. 34 is a cross-sectional view taken along line XXXIV-XXXIV in FIG. 32.

As shown in FIG. 28, the plurality of cases 4 are arranged to correspond to the plurality of sealing resin members 3 (eventually to the plurality of LED chips 2). As shown in FIGS. 32 and 34, two protrusions 41 are formed in each case 4. The two protrusions 41 are placed between the two reflecting faces 4a at positions apart from each other in the direction perpendicular to the direction in which the two reflecting faces 4a are apart. The two protrusions 41 do not overlap either of the two reflecting faces 4a as viewed in the z direction.

As shown in FIG. 34, each protrusion 41 engages with a fixing hole 11a formed through the substrate 1, whereby the case 4 is secured with respect to the substrate 1. In this embodiment, the protrusion 41 has a fixed-diameter portion 41a and a large-diameter portion 41b. The fixed-diameter portion 41a fits in through the fixing hole 11a of the substrate 1. The large-diameter portion 41b, constituting a tip portion of the protrusion 41, expands from the reverse surface 1b of the substrate 11. The large-diameter portion 41b is larger in diameter than the fixing hole 11a, thereby preventing the protrusion 41 from coming out of the fixing hole 11a. Such a large-diameter portion 41b can be formed by forming a rod-shaped portion having a fixed diameter on the case 4, inserting the rod-shaped portion through the fixing hole 11a of the substrate 1, and then deforming the tip of the rod-shaped portion by heating, i.e., heat caulking, for example. In this embodiment, the case 4 is secured to the substrate 1 with the two protrusions 41, with no adhesive used.

Figure 29:
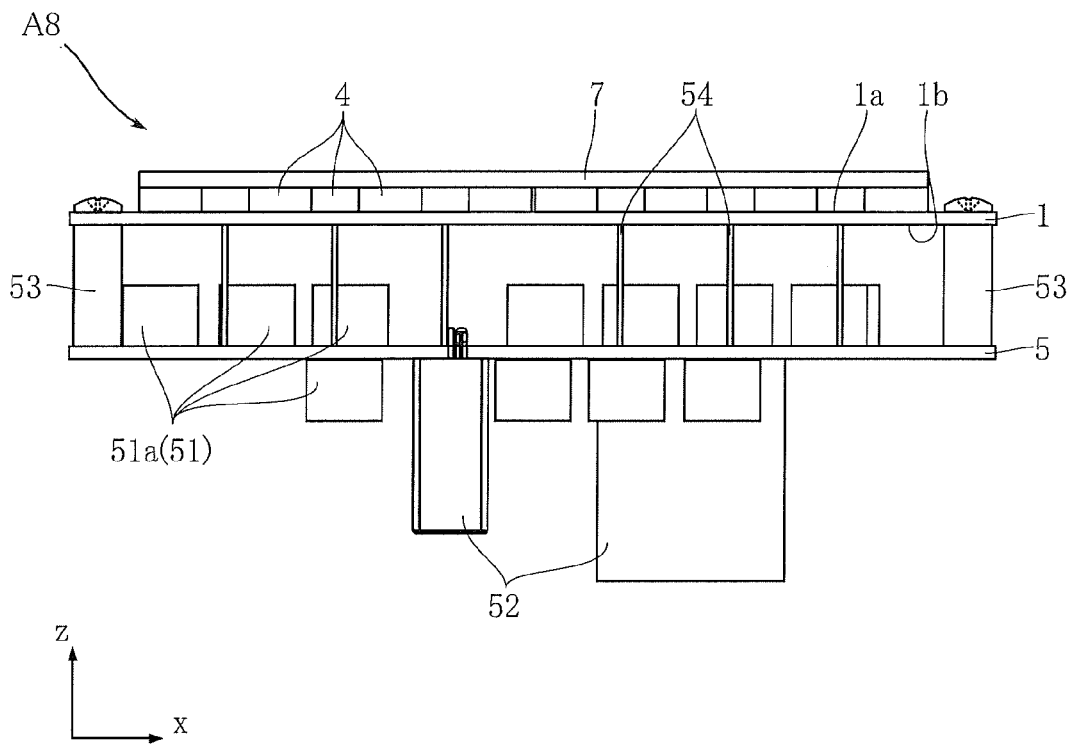
FIG. 29 is a front view showing the LED lighting apparatus of FIG. 28.
Figure 30:
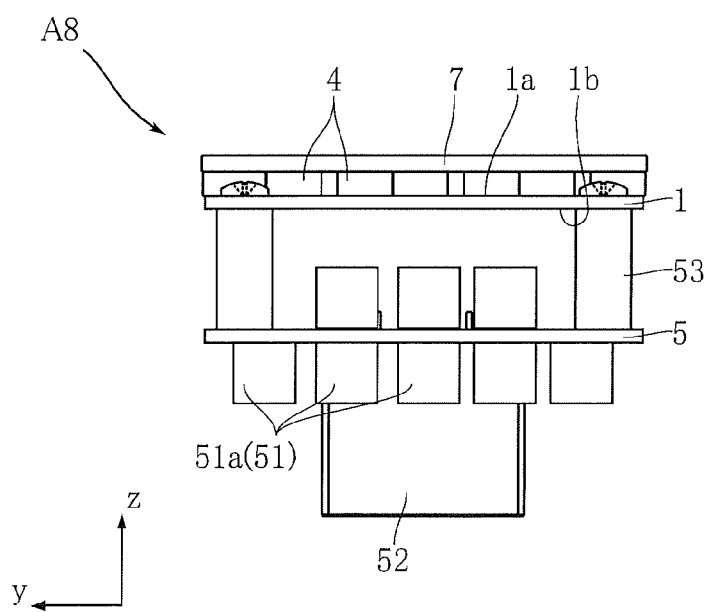
FIG. 30 is a side view showing the LED lighting apparatus of FIG. 28.
Figure 35:
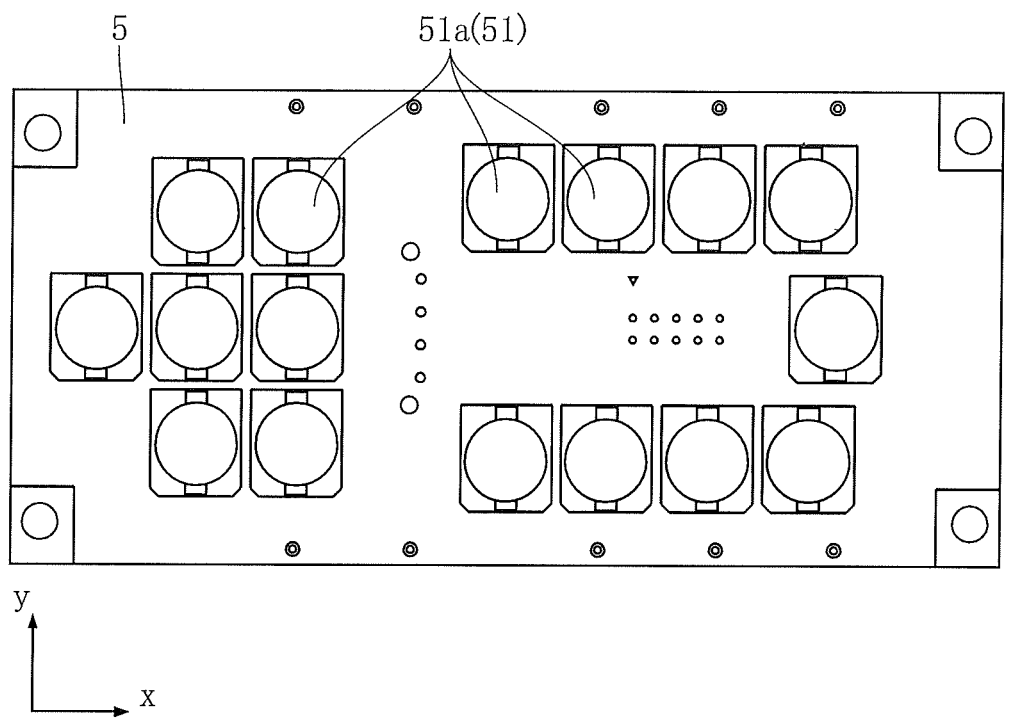
FIG. 35 is a plan view showing an auxiliary substrate of the LED lighting apparatus of FIG. 28.
Figure 36:
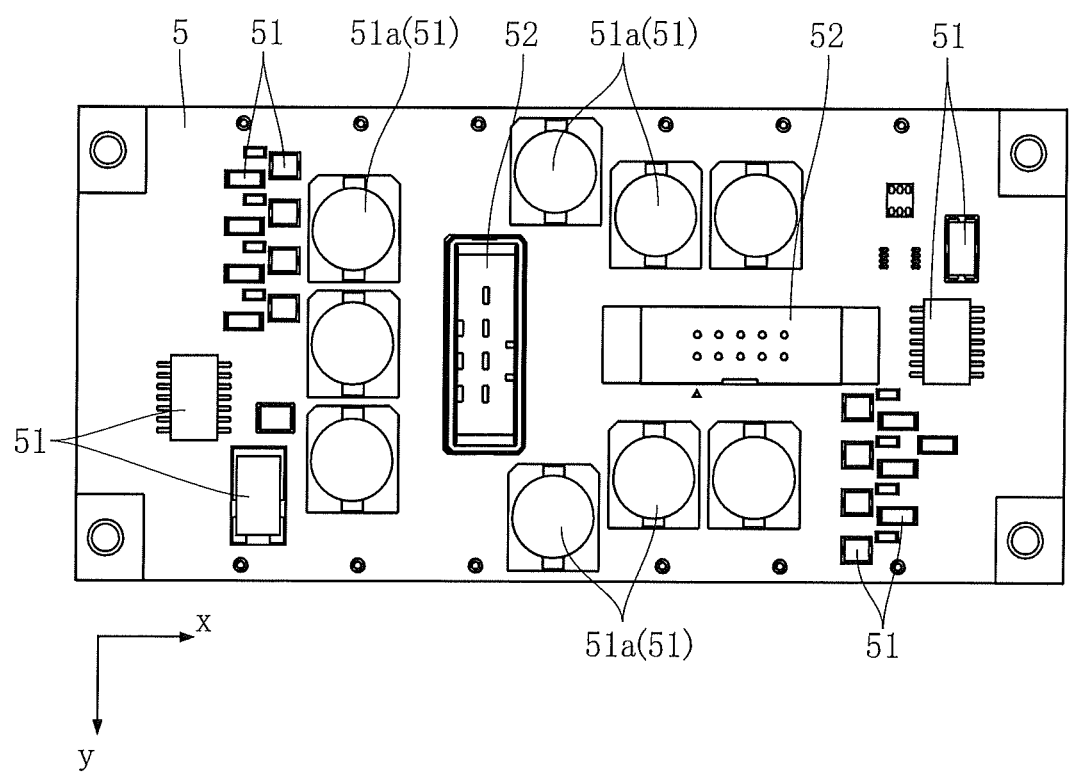
FIG. 36 is a bottom view showing the auxiliary substrate.

The auxiliary substrate 5 includes a base (made of a glass epoxy resin, for example) and a wiring pattern formed on this base. A plurality of electronic components and two connectors 52 are mounted on the auxiliary substrate 5. FIG. 35 is a plan view of the auxiliary substrate 5, and FIG. 36 is a bottom view thereof. As shown in FIG. 29, the auxiliary substrate 5 is placed apart from the substrate 1 to face the reverse surface lb of the substrate 1. In this embodiment, the auxiliary substrate 5 is in parallel with the substrate 1. The auxiliary substrate 5 and the substrate 1 are coupled to each other with four coupling rods 53. Also, a plurality of conductive rods 54 are attached to the auxiliary substrate 5 and the substrate 1. Each conductive rod 54 includes a conductive member made of a metal, and the conductive member is covered with an insulating coating, for example. The conductive rod 54 is connected to an appropriate position of the wiring pattern 12 of the substrate 1 and an appropriate position of the wiring pattern of the auxiliary substrate 5.

The plurality of electronic components 51 are for lighting up the plurality of LED chips 2, and include ICs for drive control, chip resistors, and diodes, for example. In this embodiment, the plurality of electronic components include a plurality of capacitors 51a. These capacitors 51a have a function of storing electric power for allowing the plurality of LED chips 2 to emit light with high brightness simultaneously. As shown in FIGS. 29, 30, 35, and 36, part of the plurality of capacitors 51a are mounted on one surface of the auxiliary substrate 5 while the remainder of the capacitors 51a on the other surface thereof.

The two connectors 52 are used when the LED lighting apparatus A8 is incorporated in a traffic information system, for example. As shown in FIGS. 29 and 36, the two connectors 52 are mounted on one surface (surface opposite from the substrate 1) of the auxiliary substrate 5.

The cover 7, made of a transparent resin, for example, is provided to cover the plurality of sealing resin members 3 and the plurality of cases 4. In FIG. 28, the cover 7 is represented by the two-dot chain line. The cover 7 has a function of protecting the plurality of sealing resin members 3 and the plurality of cases 4. The surface of the cover 7 may be machined (e.g., fine prisms may be formed) to refract light emitted from the plurality of LED chips 2 in a specific direction.

As shown in FIG. 33, part of the light emitted from the LED chip 2 is output upward through the dome portion 32 of the sealing resin member 3. At this time, with the upwardly bulging dome portion 32, the directionality of the output light is enhanced so that the light travel in the z direction. The other part of the light emitted from the LED chip 2 is reflected by the reflecting face 4a after having been output from the columnar portion 31 of the sealing resin member 3, whereby the light travels upward in the z direction. In this way, most of the light emitted from the LED chip 2 can be directed toward the object to be illuminated.

The upper electrode 21 and the wire bonding pad 12b are connected by the two wires 25. Therefore, a large current can be supplied to the LED chip 2, and this contributes to improvement in the brightness of the LED lighting apparatus A8. Also, with the two wires 25 extending in the opposite directions from the LED chip 2, deterioration in the shape of the sealing resin member 3 can be avoided.

The reflecting face 4a has a ring shape as viewed in the z direction and also has an aspheric shape. Therefore, the reflecting face 4a can reflect light from the LED chip 2 efficiently in the z direction.

The case 4 is made of a resin member subjected to metal coating. The resin member can be easily formed into a desired shape and size. The metal coating contributes to enhancement in the reflectivity of the reflecting face 4a.

With a plurality of LED chips 2 mounted on the substrate 1, a high-brightness light source device emitting planar light can be provided. With a plurality of cases 4 spaced from one another, even if an individual case 4 is thermally deformed at use, the substrate 1 can be prevented from being unduly deformed.

Since the plurality of LED chips 2 are arranged such that each LED chip is located at an apex of a triangle, planar light with a uniform brightness distribution can be output.

The case 4 is secured to the substrate 1 with the protrusions 41 engaging with the fixing holes 11a of the substrate 1. Therefore, the case 4 can be secured to the substrate 1 without fail. Also, at the time of thermal deformation, it is possible to prevent or reduce such an occurrence that the case 4 and the substrate 1 may affect each other.

With the two protrusions 41 located between the two adjacent reflecting faces 4a, the case 4 can be secured to the substrate 1 in balance. Also, with the provision of the protrusions 41, the case 4 can be avoided from increasing in size. Since the protrusions 41 do not overlap the reflecting faces 4a as viewed in the z direction, the reflecting faces 4a can be prevented from undue deformation in the process of heat caulking for attaching the case 4 to the substrate 1.

With the auxiliary substrate 5 provided on the side of the substrate 1 opposite to the side on which the plurality of LED chips 2 are provided, a plurality of electronic components 51 can be placed without blocking output of light. Also, since the auxiliary substrate 5 is apart from the substrate 1, a plurality of electronic components 51 can be provided on both surfaces of the auxiliary substrate 5. The capacitors 51a has a function of storing electric power required for allowing the plurality of LED chips 2 to emit light with high brightness simultaneously. Therefore, providing a larger number of capacitors 51a is suitable for improvement in the brightness of the LED lighting apparatus A8. The placement in this embodiment, in which a number of capacitors 51a are provided on both surfaces of the auxiliary substrate 5, is therefore advantageous in brightness improvement.

The LED lighting apparatuses according to the invention are not limited to the embodiments described above, and the specific configurations of the components of the devices can be freely changed in design in various ways.

As described above, a plurality of LED chips may be covered with one sealing resin member. Such a plurality of LED chips may be three LED chips emitting red light, green light, and blue light, for example. The LED chips may be of a flip chip type using no connection wire.

Variations of the present invention will be listed as follows as supplementary appendixes.

[Appendix 1]
An LED lighting apparatus including:
an LED substrate having a main surface;
an LED chip provided on the main surface of the LED substrate; and
a sealing resin member made of a material that transmits light from the LED chip, the member covering the LED chip,
wherein the sealing resin member includes a columnar portion that is in contact with the main surface and a dome portion that is formed on the columnar portion and bulges in a direction in which the main surface faces.

[Appendix 2]
The LED lighting apparatus of appendix 1, wherein the columnar portion covers the entirety of the LED chip.

[Appendix 3]
The LED lighting apparatus of appendix 2, further including a wire bonded to the LED chip, wherein
the columnar portion covers the entirety of the wire.

[Appendix 4]
The LED lighting apparatus of appendix 1, wherein the columnar portion is circular in cross section.

[Appendix 5]
The LED lighting apparatus of appendix 1, wherein the columnar portion and the dome portion respectively have a top surface and a bottom surface that are in contact with each other, and an outer rim of the top surface and an outer rim of the bottom surface coincide with each other.

[Appendix 6]
The LED lighting apparatus of appendix 5, wherein the angle formed between the top surface of the columnar portion and the side surface of the columnar portion is acute.

[Appendix 7]
The LED lighting apparatus of appendix 1, wherein the surface roughness of the columnar portion is larger than the surface roughness of the dome portion.

[Appendix 8]
The LED lighting apparatus of appendix 1, wherein the sealing resin member includes a fluorescent material, and, by being excited by light from the LED chip, the fluorescent material emits light different in wavelength from the light from the LED chip.

[Appendix 9]
The LED lighting apparatus of appendix 8, wherein only the columnar portion includes the fluorescent material.

[Appendix 10]
The LED lighting apparatus of appendix 8, wherein only the dome portion includes the fluorescent material.

[Appendix 11]
The LED lighting apparatus of appendix 1, further comprising a shading layer supported by the main surface of the LED substrate, wherein the shading layer surrounds the columnar portion and also shades light from the LED chip.

[Appendix 12]
The LED lighting apparatus of appendix 11, wherein the shading layer is made of a resin sheet joined to the main surface.

[Appendix 13]
The LED lighting apparatus of appendix 11, wherein the shading layer is made of a resin fed to fill a portion surrounding the columnar portion.

[Appendix 14]
The LED lighting apparatus of appendix 1, wherein the substrate has a recess portion recessed from the main surface, and the columnar portion is housed in the recess portion.

[Appendix 15]
The LED lighting apparatus of appendix 1, further including a reflecting face surrounding the sealing resin member.

[Appendix 16]
The LED lighting apparatus of appendix 15, further including a case supported by the LED substrate, and the reflecting face is constituted by the case.

[Appendix 17]
The LED lighting apparatus of appendix 16, wherein the reflecting face has a ring shape as viewed in the thickness direction of the LED substrate and has an aspheric shape.

[Appendix 18]
The LED lighting apparatus of appendix 16, wherein the case includes a resin member and a metal coating formed on the resin member.

[Appendix 19]
The LED lighting apparatus of appendix 1, further including an auxiliary substrate and a plurality of electronic components provided on the auxiliary substrate,
wherein the auxiliary substrate is apart from the LED substrate, and the plurality of electronic components are provided for activating the LED chip.

[Appendix 20]
The LED lighting apparatus of appendix 19, wherein the auxiliary substrate is in parallel with the LED substrate.

[Appendix 21]
The LED lighting apparatus of appendix 19, wherein the plurality of electronic components are mounted on two surfaces of the auxiliary substrate.

[Appendix 22]

The LED lighting apparatus of appendix 19, wherein the plurality of electronic components include a capacitor.

[Appendix 23]

The LED lighting apparatus of appendix 19, further including a connector, wherein the auxiliary substrate has a surface facing the LED substrate and a reverse surface opposite to the surface, and the connector is mounted on the reverse surface of the auxiliary substrate.

[Appendix 24]

An LED lighting apparatus including:

an LED substrate having a main surface and a reverse surface;

a plurality of LED chips provided on the main surface of the LED substrate;

a plurality of light-transmissive sealing resin members covering the plurality of LED chips; and a plurality of cases provided on the main surface of the LED substrate, wherein each of the plurality of sealing resin members includes a columnar portion that is in contact with the main surface and a dome portion that is formed on the columnar portion and bulges in a direction in which the main surface faces, and each of the plurality of cases includes two reflecting faces, and each of the reflecting faces surrounds one of the plurality of LED chips.

[Appendix 25]

The LED lighting apparatus of appendix 24, wherein each of the plurality of LED chips is located at an apex of a triangle.

[Appendix 26]

The LED lighting apparatus of appendix 24, wherein a plurality of fixing holes are formed through the LED substrate, and each of the cases includes a fixed-diameter portion and a large-diameter portion larger in size than the fixed-diameter portion, the fixed-diameter portion sits inside one of the plurality of fixing holes, and the large-diameter portion engages with the reverse surface of the LED substrate.

[Appendix 27]

A production method for an LED lighting apparatus, including the steps of:

preparing an LED substrate having a main surface on which an LED chip is mounted;

joining a sheet having an opening to the LED substrate so that the opening can house the LED chip inside;

filling the opening with a first resin material;

hardening the first resin material to form a columnar portion having a surface facing in the same direction as that in which the main surface faces;

dropping a second resin material onto the surface of the columnar portion; and hardening the second resin material to form a dome portion.

[Appendix 28]

The production method for an LED lighting apparatus of appendix 27, further including the step of removing the sheet from the LED substrate after the step of hardening the first resin material and before the step of dropping the second resin material.

The invention claimed is:

1. An LED lighting apparatus comprising:

an LED substrate having a main surface;

an LED chip mounted on the main surface of the LED substrate;

a sealing resin member made of a material that transmits light from the LED chip, the sealing resin member covering the LED chip and having a shape of bulging in a direction in which the main surface faces; and a case supported by the LED substrate, and including a reflecting face surrounding the sealing resin member, wherein the sealing resin member is smaller in height with respect to the main surface of the LED substrate than the case.

2. The LED lighting apparatus according to claim 1, wherein the LED substrate includes a base made of an insulating material and formed with a wiring pattern.

3. The LED lighting apparatus according to claim 2, further comprising a first wire, wherein the wiring pattern includes a die bonding pad to which the LED chip is die-bonded and a wire bonding pad that is in conduction with the LED chip via the first wire.

4. The LED lighting apparatus according to claim 3, wherein the wire bonding pad surrounds the die bonding pad.

5. The LED lighting apparatus according to claim 4, wherein an outer rim of the sealing resin member coincides with an outer rim of the wire bonding pad.

6. The LED lighting apparatus according to claim 3, wherein the LED chip includes a lower electrode joined to the die bonding pad and an upper electrode opposite to the lower electrode.

7. The LED lighting apparatus according to claim 6, wherein the first wire connects the upper electrode and the wire bonding pad.

8. The LED lighting apparatus according to claim 7, further comprising a second wire, wherein the second wire connects the upper electrode and the wire bonding pad.

9. The LED lighting apparatus according to claim 8, wherein the first wire and the second wire extend in opposite directions from the LED chip.

10. The LED lighting apparatus according to claim 3, wherein the entirety of the first wire is covered with the sealing resin member.

11. The LED lighting apparatus according to claim 1, wherein the sealing resin member includes a columnar portion covering the entirety of the LED chip and a dome portion formed on the columnar portion.

12. The LED lighting apparatus according to claim 1, wherein the reflecting face has a ring shape as viewed in a thickness direction of the LED substrate and has an aspheric shape.

13. The LED lighting apparatus according to claim 1, wherein the case includes a resin member subjected to metal coating.

14. An LED lighting apparatus, comprising:

an LED substrate having a main surface;

an LED chip mounted on the main surface of the LED substrate;

a sealing resin member made of a material that transmits light from the LED chip, the sealing resin member covering the LED chip and having a shape of bulging in a direction in which the main surface faces;

a reflecting face surrounding the sealing resin member; and a plurality of electronic components for activating the LED chip and an auxiliary substrate for mounting the electronic components, wherein the auxiliary substrate is placed apart from the LED substrate, and the auxiliary substrate includes a first surface facing the LED substrate and a second surface opposite to the first surface.

15. The LED lighting apparatus according to claim 14, wherein the auxiliary substrate is in parallel with the LED substrate.

16. The LED lighting apparatus according to claim 14, wherein the plurality of electronic components are mounted on the first surface and the second surface of the auxiliary substrate.

17. The LED lighting apparatus according to claim 14, wherein the plurality of electronic components include a capacitor.

18. The LED lighting apparatus according to claim 14, further comprising a connector mounted on the second surface of the auxiliary substrate.

19. The LED lighting apparatus according to claim 1, further comprising a prism lens, wherein the prism lens includes a recess portion that houses the sealing resin member and an outer side surface that functions as the reflecting face.

20. The LED lighting apparatus according to claim 19, wherein the reflecting face has a ring shape as viewed in a thickness direction of the LED substrate and has an aspheric shape.

21. The LED lighting apparatus according to claim 19, wherein the bottom surface of the recess portion bulges toward the LED chip.

22. An LED module comprising:
a substrate having a main surface and formed with an opening;
a first electrode including an outer portion and an inner portion connected to the outer portion, the outer portion being formed on the main surface of the substrate, the inner portion being formed in the opening;
an LED chip mounted on the main surface of the substrate and electrically connected to the first electrode; and
a resin member made of a material that transmits light from the LED chip, the resin member covering the LED chip and the first electrode in plan view and bulging in a direction in which the main surface faces,
wherein the outer portion of the first electrode is greater in size than the inner portion of the first electrode in plan view.

23. The LED module according to claim 22, further comprising a first wiring pattern formed on the main surface of the substrate and electrically connected to the first electrode.

24. The LED module according to claim 23, further comprising a first wire that connects the first wiring pattern and the LED chip to each other.

25. The LED module according to claim 24, wherein the first wire is covered with the resin member in plan view.

26. The LED module according to claim 22, wherein the opening is elongated along the direction in which the main surface faces.

27. The LED module according to claim 22, further comprising a second electrode formed on the main surface of the substrate and spaced apart from the first electrode, wherein the LED chip is mounted on the second electrode.

28. The LED module according to claim 22, further comprising a third electrode that is parallel to the second electrode and space apart from the second electrode in the direction in which the main surface faces.

* * * * *